(12) United States Patent
Na et al.

(10) Patent No.: US 11,004,926 B2
(45) Date of Patent: May 11, 2021

(54) ORGANIC LIGHT EMITTING DIODE DISPLAY DEVICE

(71) Applicant: SAMSUNG DISPLAY CO., LTD., Yongin-si (KR)

(72) Inventors: Jisu Na, Yongin-si (KR); Seung-Kyu Lee, Yongin-si (KR); Kwang-Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 274 days.

(21) Appl. No.: 16/295,257

(22) Filed: Mar. 7, 2019

(65) Prior Publication Data

US 2019/0312096 A1    Oct. 10, 2019

(30) Foreign Application Priority Data

Apr. 9, 2018 (KR) .................. 10-2018-0041051

(51) Int. Cl.
*H01L 27/32* (2006.01)
*H01L 51/50* (2006.01)
*H01L 51/52* (2006.01)

(52) U.S. Cl.
CPC ...... *H01L 27/3276* (2013.01); *H01L 27/3246* (2013.01); *H01L 51/5012* (2013.01); *H01L 51/5256* (2013.01); *G09G 2320/0223* (2013.01)

(58) Field of Classification Search
CPC ............ H01L 27/3276; H01L 27/3244; H01L 27/3246; H01L 27/326; G09G 2320/0223
See application file for complete search history.

(56) References Cited

U.S. PATENT DOCUMENTS

| | | | |
|---|---|---|---|
| 10,559,253 B1 * | 2/2020 | Li | G09G 3/3225 |
| 10,559,597 B1 * | 2/2020 | Li | G09G 3/20 |
| 10,644,038 B2 * | 5/2020 | Wang | G06F 3/0412 |
| 10,680,054 B2 * | 6/2020 | Ka | H01L 27/3244 |
| 10,769,994 B2 * | 9/2020 | Ka | G09G 3/3648 |
| 10,838,532 B2 * | 11/2020 | Abe | G06F 3/0412 |
| 10,879,338 B2 * | 12/2020 | Kim | H01L 27/3279 |
| 2017/0294502 A1 * | 10/2017 | Ka | H01L 27/3276 |
| 2017/0301280 A1 * | 10/2017 | Ka | G09G 3/3406 |
| 2018/0005585 A1 * | 1/2018 | Kim | H01L 27/3223 |
| 2018/0090061 A1 * | 3/2018 | Kim | G09G 3/3233 |
| 2018/0129106 A1 * | 5/2018 | Gao | G09G 3/3611 |

(Continued)

FOREIGN PATENT DOCUMENTS

KR    10-2017-0102147 A    9/2017

*Primary Examiner* — Bac H Au
(74) *Attorney, Agent, or Firm* — Kile Park Reed & Houtteman PLLC

(57) ABSTRACT

An organic light emitting diode ("OLED") display device includes a substrate having a display region having a light emitting region and a peripheral region surrounding the light emitting region, a pad region at a first side of the display region, and a trench at a second side of the display region, a plurality of light emitting structures on the light emitting region of the substrate, an active pattern along a profile of the trench on the peripheral region of the substrate, the active pattern being adjacent to the trench and including a pattern protrusion, and an upper gate wiring on and overlapping the active pattern, the upper gate wiring having a wiring protrusion adjacent to the pattern protrusion.

20 Claims, 21 Drawing Sheets

(56) References Cited

U.S. PATENT DOCUMENTS

| | | | |
|---|---|---|---|
| 2018/0204889 A1* | 7/2018 | Yu | G09G 3/3266 |
| 2019/0096914 A1* | 3/2019 | Hosokawa | G02F 1/136286 |
| 2019/0131360 A1* | 5/2019 | Lee | G09G 3/3233 |
| 2019/0181213 A1* | 6/2019 | Lim | G09G 3/3266 |
| 2019/0331974 A1* | 10/2019 | Furuta | G02F 1/136286 |
| 2019/0392767 A1* | 12/2019 | Kim | G09G 3/3225 |
| 2021/0026481 A1* | 1/2021 | Abe | G06F 3/0412 |

\* cited by examiner

ORGANIC LIGHT EMITTING DIODE DISPLAY DEVICE

CROSS-REFERENCE TO RELATED APPLICATION

Korean Patent Application No. 10-2018-0041051, filed on Apr. 9, 2018, in the Korean Intellectual Property Office, and entitled: "Organic Light Emitting Diode Display Device," is incorporated by reference herein in its entirety.

BACKGROUND

1. Field

Example embodiments relate generally to an organic light emitting display device. More particularly, example embodiments relate to an organic light emitting display device including a trench.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting diode ("OLED") display device.

Recently, an OLED display device, where a trench (or a groove) is formed in a portion of a substrate included in the OLED display device, has been developed. For example, the OLED display device may include a plurality of light emitting structures capable of emitting a light, and the light emitting structures may be disposed in both a first light emitting region having a first width and a second light emitting region having a second width that is less than the first width. The second light emitting region may be located along both lateral portions of the trench.

SUMMARY

According to some of example embodiments, an OLED display device may include a substrate, a plurality of light emitting structures, an active pattern, and an upper gate wiring. The substrate has a display region that includes a light emitting region and a peripheral region surrounding the light emitting region and a pad region that located in a first side portion of the display region, and has a trench that is located in a second side portion of the display region. The light emitting structures are disposed in the light emitting region on the substrate. The active pattern is disposed along a profile of the trench in the peripheral region, which is located adjacent to the trench, on the substrate, and has a pattern protrusion. The upper gate wiring is disposed on and overlapping the active pattern, and has a wiring protrusion that is located adjacent to the pattern protrusion.

In example embodiments, the OLED display device may further include a connection pattern disposed on and overlapping the pattern protrusion and the wiring protrusion. The connection pattern may electrically connect the pattern protrusion and the wiring protrusion through a contact hole, and the connection pattern together with the active pattern and the upper gate wiring overlapping the active pattern may be defined as a stack structure.

In example embodiments, the light emitting region of the substrate may include a first light emitting region located adjacent to the pad region and second and third light emitting regions located in both lateral portion of the trench.

In example embodiments, the first light emitting region may have a first width, and each of the second and third light emitting regions may have a second width that is less than the first width.

In example embodiments, the peripheral region of the substrate may include a first peripheral region located adjacent to the first light emitting region, second and third peripheral regions located adjacent to the second and third light emitting regions, respectively, and a fourth peripheral region located adjacent to the trench.

In example embodiments, a portion of the fourth peripheral region may be located adjacent to the first light emitting region, and a remaining portion of the fourth peripheral region may be located adjacent to the second and third light emitting regions.

In example embodiments, the OLED display device may further include a lower gate wiring disposed in the first light emitting region. The lower gate wiring may have a shape of a straight line. The upper gate wiring may be disposed in the second and third light emitting regions and the fourth peripheral region, and a total distance of the upper gate wiring may be greater than a total distance of the lower gate wiring.

In example embodiments, a shape of the trench may have a plan shape of a semicircle in a plan view of the OLED display device.

In example embodiments, the active pattern may have a shape of a curve in the fourth peripheral region. The upper gate wiring may have a shape of a straight line in the second and third light emitting regions, and may have a shape of a curve in the fourth peripheral region.

In example embodiments, the number of the light emitting structures arranged along each of row directions in the second and third light emitting regions may be gradually increased in a direction from the display region into the pad region.

In example embodiments, the active pattern may include first through (N)th active patterns, where N is an integer greater than 1, and the first through (N)th active patterns may be disposed in the fourth peripheral region.

In example embodiments, the first active pattern among the first through (N)th active patterns may be disposed at an outermost portion of the fourth peripheral region, and the (N)th active pattern among the first through (N)th active patterns may be disposed at an inside portion of the fourth peripheral region.

In example embodiments, a distance of the (K)th active pattern among the first through (N)th active patterns may be greater than a distance of the (K+1)th active pattern among the first through (N)th active patterns, where K is an integer between 1 and N.

In example embodiments, the upper gate wiring may include first through (M)th upper gate wirings, where M is an integer greater than 1, and the (K)th active pattern among the first through (N)th active patterns may be disposed to overlap the (L)th upper gate wiring among first through (M)th upper gate wirings, where K is an integer between 1 and N, and L is an integer between 1 and M.

In example embodiments, a shape of the trench may have a plan shape of a tetragonal in a plan view of the OLED display device.

In example embodiments, the active pattern may have a shape of a straight line in the fourth peripheral region. The upper gate wiring may have a shape of a straight line in the second and third light emitting regions, and may have a U-shape in the fourth peripheral region.

In example embodiments, the number of the light emitting structures arranged along each of row directions in the second and third light emitting regions may be the same.

In example embodiments, the active pattern may include first through (N)th active patterns, where N is an integer greater than 1, and the first through (N)th active patterns may be disposed in the fourth peripheral region.

In example embodiments, a distance of a (K)th active pattern among the first through (N)th active patterns may be identical to a distance of a (K+1)th active pattern among the first through (N)th active patterns, where K is an integer between 1 and N.

In example embodiments, the OLED display device may further include a plurality of semiconductor elements disposed in the display region between the substrate and the light emitting structures. Each of the semiconductor elements may include an active layer disposed on the substrate, a gate insulation layer disposed on the active layer, a gate electrode disposed on the gate insulation layer, a first insulating interlayer disposed on the gate electrode, and source and drain electrodes disposed on the first insulating interlayer. The active pattern and the active layer may be located at a same layer, and the gate wiring and the upper gate electrode may be located at a same layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
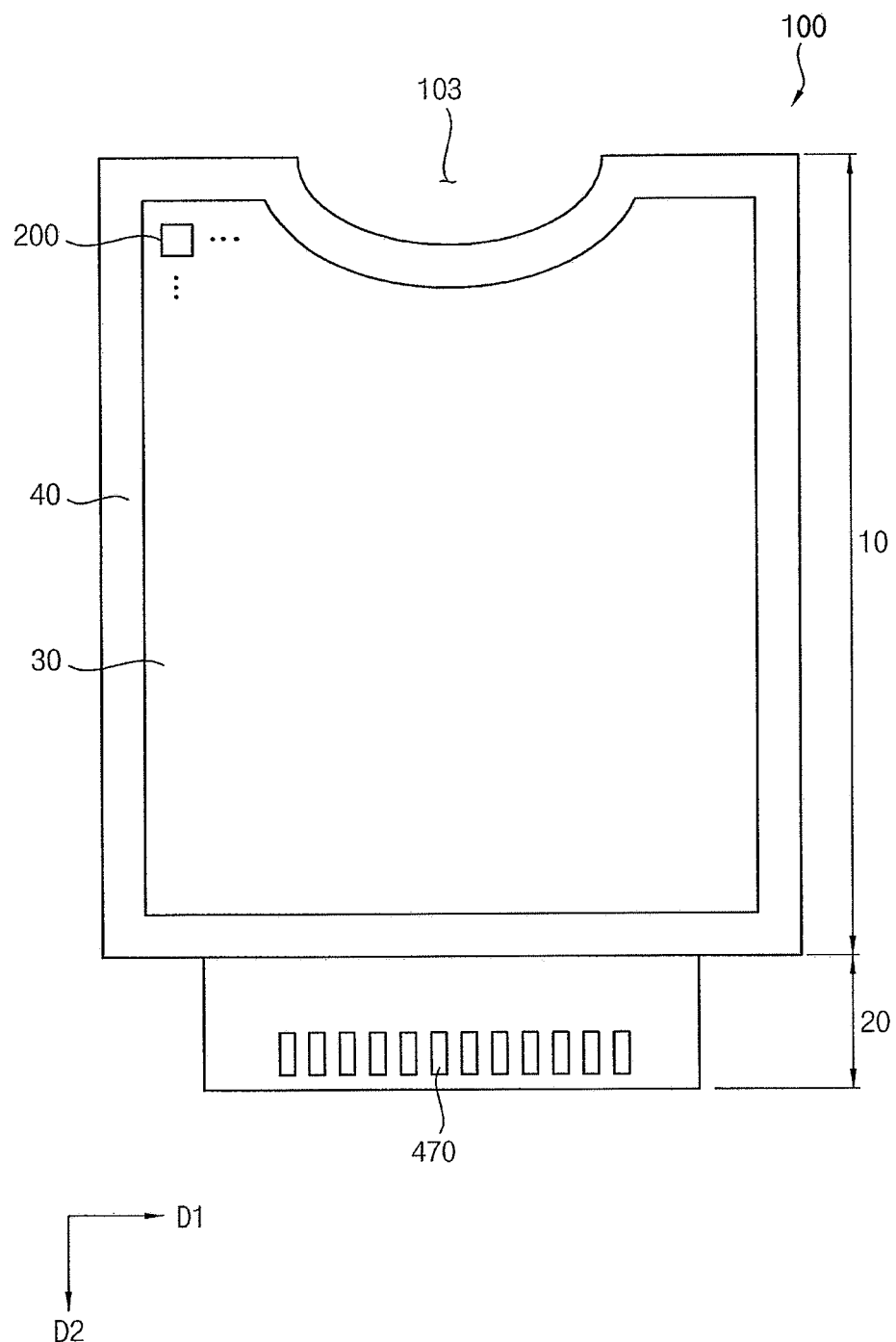
FIG. 1 illustrates a plan view of an organic light emitting diode ("OLED") display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, example embodiments will be explained in detail with reference to the accompanying drawings.

Figure 2:
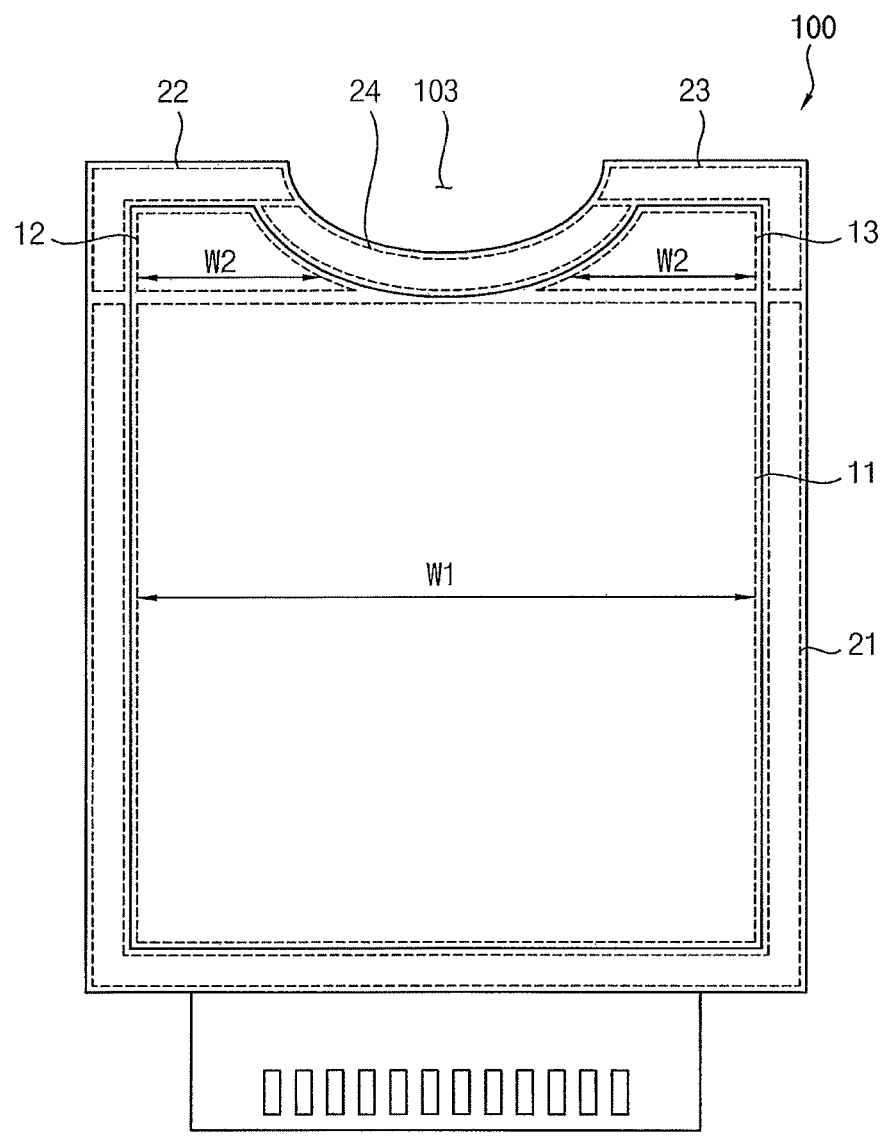
FIG. 2 illustrates a plan view of a light emitting region and a peripheral region of the OLED display device of FIG. 1.

FIG. 1 is a plan view illustrating an organic light emitting diode ("OLED") display device in accordance with example embodiments, and FIG. 2 is a plan view for describing a light emitting region and a peripheral region of in the OLED display device of FIG. 1.

Referring to FIGS. 1 and 2, an OLED display device 100 may include a display region 10 and a pad region 20. The display region 10 may include a light emitting region 30 and a peripheral region 40 surrounding the light emitting region 30, and the light emitting region 30 may include a first light emitting region 11, a second light emitting region 12, and a third light emitting region 13. In addition, the peripheral region 40 may include a first peripheral region 21, a second peripheral region 22, a third peripheral region 23, and a fourth peripheral region 24.

In example embodiments, a width of the peripheral region 40 surrounding the light emitting region 30 has a same width, i.e., is constant along each of the first and second directions D1 and D2, but is not limited thereto. For example, in some example embodiments, a width of each of the first peripheral region 21, the second peripheral region 22, the third peripheral region 23, and the fourth peripheral region 24 may be different from each other.

As illustrated in FIG. 1, a plurality of light emitting structures 200 may be disposed in the display region 10, and the pad region 20 may be located at a first side of the display region 10. Pad electrodes 470 may be disposed in the pad region 20, and may be electrically connected to an external device. A width extending in the first direction D1 of the pad region 20 may be less than a width extending in the first direction D1 of the display region 10, e.g., a width of the pad region 20 in the first direction D1 may be less than a width of the display region 10 in the first direction D1. Alternatively, the width of the pad region 20 may be identical to the width of the display region 10 in the first direction D1. For example, the first direction D1 may be a direction that is in parallel to an upper surface of the OLED display device 100.

In example embodiments, the OLED display device 100 may have a trench 103, e.g., a groove, located at a second side of the display region 10. The first side of the display region 10 may be different from the second side of the display region 10, e.g., the trench 103 and the pad region 20 may be at opposite sides of the display region 10 along the second direction D2 (i.e., as viewed in a top view). In detail, the OLED display device 100 may have a dent shape, e.g., a depressed shape, in a direction oriented from the peripheral region 40 into the light emitting region 30 in a portion of the display region 10 to define the trench 103. For example, a shape of the trench 103 may have a plan shape of a semicircle in a plan view of the OLED display device 100.

In example embodiments, the shape of the trench 103 has a plan shape of a semicircle, but is not limited thereto. For example, a shape of the trench 103 may have a plan shape of a tetragon, a plan shape of a triangle, a plan shape of a rhombus, a plan shape of a polygon, a plan shape of a circle, a plan shape of an athletic track, or a plan shape of an oval.

As illustrated in FIG. 2, the first light emitting region 11 may be adjacent to the pad region 20, e.g., the first light emitting region 11 may be between the pad region 20 and the trench 103 along the second direction D2, and the second light emitting region 12 and the third light emitting region 13 may be located in both lateral portions of the trench 103. For example, as illustrated in FIG. 2, the second light emitting region 12 and the third light emitting region 13 may be spaced apart from each other along the first direction D1 to be adjacent to a respective lateral portion of the trench 103 along the first direction D1, and each of the second light emitting region 12 and the third light emitting region 13 may be connected to, e.g., integral with, a portion of the first light emitting region 11 along the second direction D2. For example, as further illustrated in FIG. 2, a portion of the trench 103 may be between the second light emitting region 12 and the third light emitting region 13 along the first direction D1.

A first width W1 of the first light emitting region 11 in the first direction D1 may be greater than a second width W2 of each of the second light emitting region 12 and the third light emitting region 13 in the first direction D1. For example, the first width W1 of the first light emitting region 11 may be constant, while the second width W2 of each of the second light emitting region 12 and the third light emitting region 13 may vary in accordance with a shape of the trench 103, e.g., the second width W2 may gradually increase when each of the second light emitting region 12 and the third light emitting region 13 traces a shape of the semicircular trench 103 (e.g., as viewed in top view in FIG. 2).

The first peripheral region 21 may be located adjacent to the first light emitting region 11 in the first direction D1, and the second peripheral region 22 and the third peripheral region 23 may be located adjacent to the second light emitting region 12 and the third light emitting region 13 in the second direction D2, respectively. In addition, the fourth peripheral region 24 may be located adjacent to the trench 103, e.g., the fourth peripheral region 24 may be between the trench 103 and the first light emitting region 11 in the second direction D2. The first peripheral region 21, the second peripheral region 22, the fourth peripheral region 24, and the third peripheral region 23 may be continuously arranged, e.g., seamlessly and integrally connected to each other along an entire perimeter of the light emitting region 30. In addition, a portion of the fourth peripheral region 24 may be located adjacent to the first light emitting region 11, and a remaining portion of the fourth peripheral region 24 may be located adjacent to the second light emitting region 12 and the third light emitting region 13. For example, as illustrated in FIG. 2, the fourth peripheral region 24 may be curved, i.e., concave relatively to the peripheral region 40, to have each of the second light emitting region 12 and the third light emitting region 13 enclosed between the first light emitting region 11, the fourth peripheral region 24, and a respective one of the second and third peripheral region 22 and 23 as viewed in a top view.

As described above, the display region 10 may include the light emitting region 30 where light is emitted and the peripheral region 40 surrounding the light emitting region 30. In example embodiments, the light emitting structures 200 capable of emitting light may be disposed in the light emitting region 30, and a plurality of wirings may be disposed in the peripheral region 40. The wirings may electrically connect pad electrodes 470 in the pad region 20 with the light emitting structures 200 in the display region 10. For example, the wirings may include data signal wiring where a data signal is applied, gate signal wirings where a gate signal is applied, light emission signal wirings where a light emission signal is applied, power supply voltage wirings where a power supply voltage is applied, an initialization signal wirings where an initialization signal is applied, etc. Each of the wirings may extend in the display region 10 such that the signals are provided to the light emitting structures 200, and the wirings may be electrically connected to the light emitting structure 200. In addition, a gate driver, a data driver, etc. may be disposed in the peripheral region 40.

In some example embodiments, the pad region 20 may include a bending region located in a portion of the pad region 20 that is located adjacent to the display region 10 and a pad electrode region located in a remaining portion of the pad region 20. For example, the bending region may be interposed between the display region 10 and the pad electrode region, and the pad electrodes 470 may be disposed in the pad electrode region. As the bending region is bent, the pad electrode region may be located on a lower surface of the OLED display device 100. Alternatively, the OLED display device 100 may further include a bending protection layer and connection electrodes. The bending protection layer may be disposed in a portion of the display region 10, the bending region, and a portion of the pad electrode region on the OLED display device 100. The connection electrodes may be disposed under the bending protection layer, and may be electrically connect the wirings and the pad electrodes 470.

The light emitting structures 200 disposed in the light emitting region 30 and the external device that is electrically connected to the pad electrodes 470 may be electrically connected through the connection electrodes disposed in the bending region and the wirings disposed in the peripheral region 40. For example, the external device and the OLED display device 100 may be electrically connected through a flexible printed circuit board ("FPCB"). The external device may provide the data signal, the gate signal, the light emission signal, the power supply voltage, the initialization signal, etc. to the OLED display device 100. In addition, a driving integrated circuit may be mounted in the FPCB. In some example embodiments, the driving integrated circuit may be mounted in a portion of the OLED display device 100 that is adjacent to the pad electrodes 470.

Figure 3:
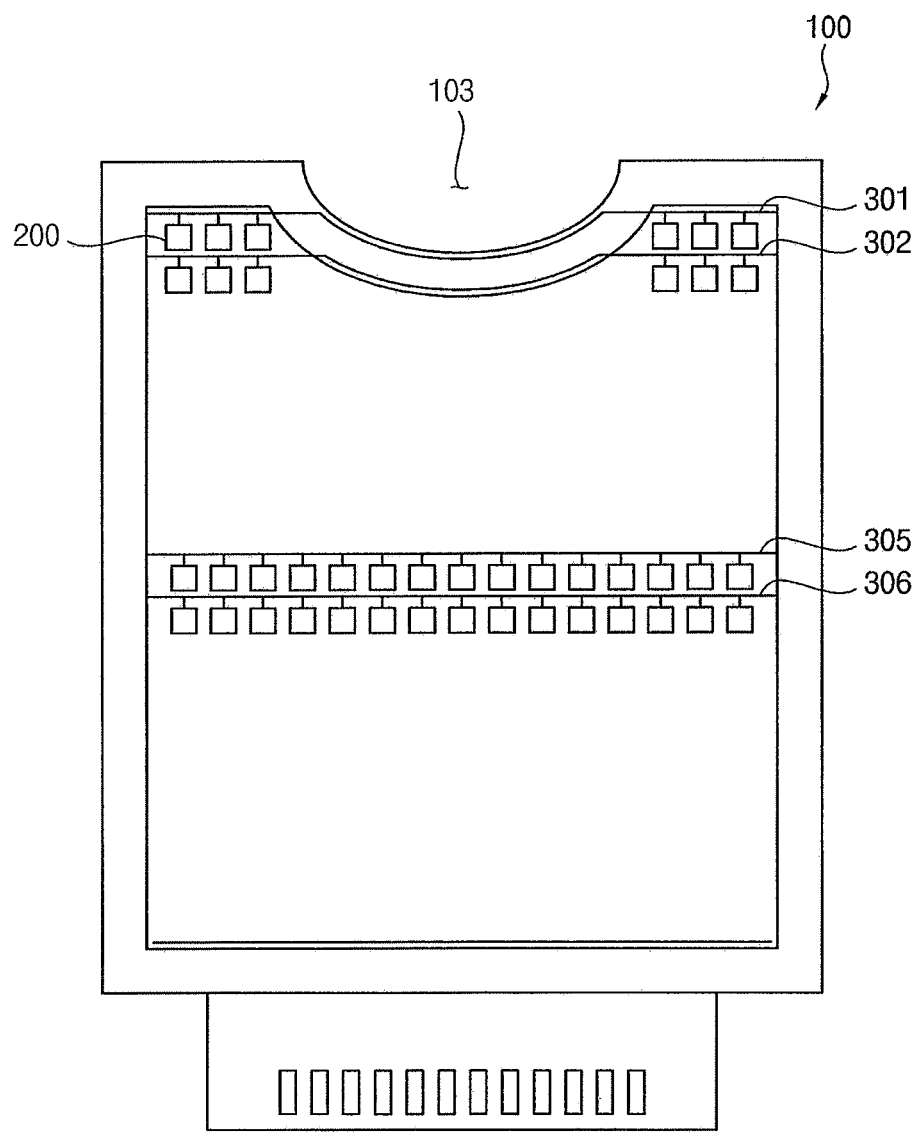
FIG. 3 illustrates a plan view of light emitting structures in first and second light emitting regions of the OLED display device of FIG. 2.

FIG. 3 is a plan view for describing the light emitting structures 200 disposed in the light emitting region 30 of in the OLED display 100.

Referring to FIGS. 2 and 3, the OLED display device 100 may include a first upper gate wiring 301, a second upper gate wiring 302, a first lower gate wiring 305, a second lower gate wiring 306, etc. For convenience of descriptions, all of the wirings included in the OLED display device 100 might not be illustrated in FIG. 3. For example, the OLED display device 100 may further include a data signal wiring, a light emission signal wiring, a power supply voltage wiring, etc. In example embodiments, the first upper gate wiring 301, the second upper gate wiring 302, the first lower gate wiring 305, and the second lower gate wiring 306 may provide gate signals to the light emitting structures 200.

In example embodiments, the OLED display device 100 includes two upper gate wirings and two lower gate wirings in FIG. 3, but is not limited thereto. For example, the OLED display device 100 may include a plurality of upper gate wirings and a plurality of lower gate wirings.

In example embodiments, the first upper gate wiring 301 and the second upper gate wiring 302 may be disposed, e.g., continuously, in the second light emitting region 12, the fourth peripheral region 24, and the third light emitting region 13 on a substrate, which will be described below, included in the OLED display device 100, and the first lower gate wiring 305 and the second lower gate wiring 306 may be disposed, e.g., continuously, in the first light emitting region 11 on the substrate. In addition, each of first and second upper gate wirings 301 and 302 may have a shape of a substantially straight line in the second and third light emitting regions 12 and 13, and may have a shape of a substantially curve in the fourth peripheral region 24. In other words, each of the first and second upper gate wirings 301 and 302 may be disposed along a profile of the trench 103 in the fourth peripheral region 24, and may be integrally formed in the second light emitting region 12, the fourth peripheral region 24, and the third light emitting region 13. On the other hand, each of first and second lower gate wirings 305 and 305 may have a shape of a substantially straight line in the first light emitting region 11. That is, as illustrated in FIG. 3, a total distance of each of the first and second upper gate wirings 301 and 302 may be greater than a total distance of each of the first and second lower gate wirings 305 and 305.

In example embodiments, a plurality of the light emitting structures 200 may be disposed in the first light emitting region 11, the second light emitting region 12, and the third light emitting region 13. As illustrated in FIG. 3, the light emitting structures 200 may be electrically connected to each of the first upper gate wiring 301, the second upper gate wiring 302, the first lower gate wiring 305, and the second lower gate wiring 306.

In example embodiments, the number of the light emitting structures 200 connected to the first upper gate wiring 301 may be less than the number of the light emitting structures 200 connected to the second upper gate wiring 302. In other words, the number of the light emitting structures 200 arranged in each of the first directions D1 (e.g., row directions) in the second light emitting region 12 and the third light emitting region 13 may be gradually increased in the second direction D2 (e.g., the second direction D2 that is perpendicular to the first direction D1 or the second direction D2 where a direction is from the display region 10 into the pad region 20). For example, in the second light emitting region 12 and the third light emitting region 13, an area of each of the second light emitting region 12 and the third light emitting region 13 may be increased in the second direction D2 due to the trench 103, which has a plan shape of a semicircle, forming on the substrate, and the number of the light emitting structures 200 arranged along the first direction D1 may be gradually increased in the second direction D2. For example, as a width of each of the second light emitting region 12 and the third light emitting region 13 increases along the first direction D1 in accordance with a decreased distance from the pad region 20 (i.e., due to the curved shape of the trench 103), a number of the light emitting structures 200 arranged along the first direction D1 may be gradually increased in each gate wiring along the second direction D2, e.g., a number of the light emitting structures 200 arranged along the first direction D1 in the second upper gate wiring 302 may be larger than that in the first upper gate wiring 301.

In addition, since the first upper gate wiring 301 and the second upper gate wiring 302 are not connected to light emitting structures 200 in the fourth peripheral region 24, e.g., there may not be any light emitting structures 200 in the fourth peripheral region 24, the first upper gate wiring 301 and the second upper gate wiring 302 may be connected to a relatively smaller number of light emitting structures 200 than the first lower gate wiring 305 and the second lower gate wiring 306 in the first light emitting region 11. In this case, a load capacitance generated between the upper gate wiring (e.g., the first upper gate wiring 301 and the second upper gate wiring 302) and active wirings disposed under the upper gate wiring may be less than a load capacitance generated between the lower gate wiring (e.g., the first lower gate wiring 305 and the second lower gate wiring 306) and the active wirings disposed under the lower gate wiring.

For example, the OLED display device 100 may further include a plurality of semiconductor elements, and the semiconductor elements may be disposed under each of the light emitting structures 200. Here, the semiconductor elements may be connected to each other through the active wirings, and the active wirings and the gate wirings disposed on the active wirings may be partially overlapped. Here, a portion where the active wiring and the gate wiring are overlapped may be defined as an active layer of the semiconductor element. Accordingly, a load capacitance of the lower gate wirings connected to the relatively larger number of the light emitting structures 200 may be relatively greater than a load capacitance of the upper gate wirings connected to the relatively smaller number of the light emitting structures 200.

When a difference of a load capacitance occurs between different regions in a display region, a luminance difference of the light emitting structures may also occur between the different regions. In this case, visibility of the OLED display device may be reduced. Therefore, according to example embodiments, in order to equalize the difference of the load capacitance between the different regions, the OLED display device 100 may further include a stack structure defining a parasitic capacitor in the fourth peripheral region 24, as will be described in more detail below with reference to FIGS. 4-5.

Figure 4:
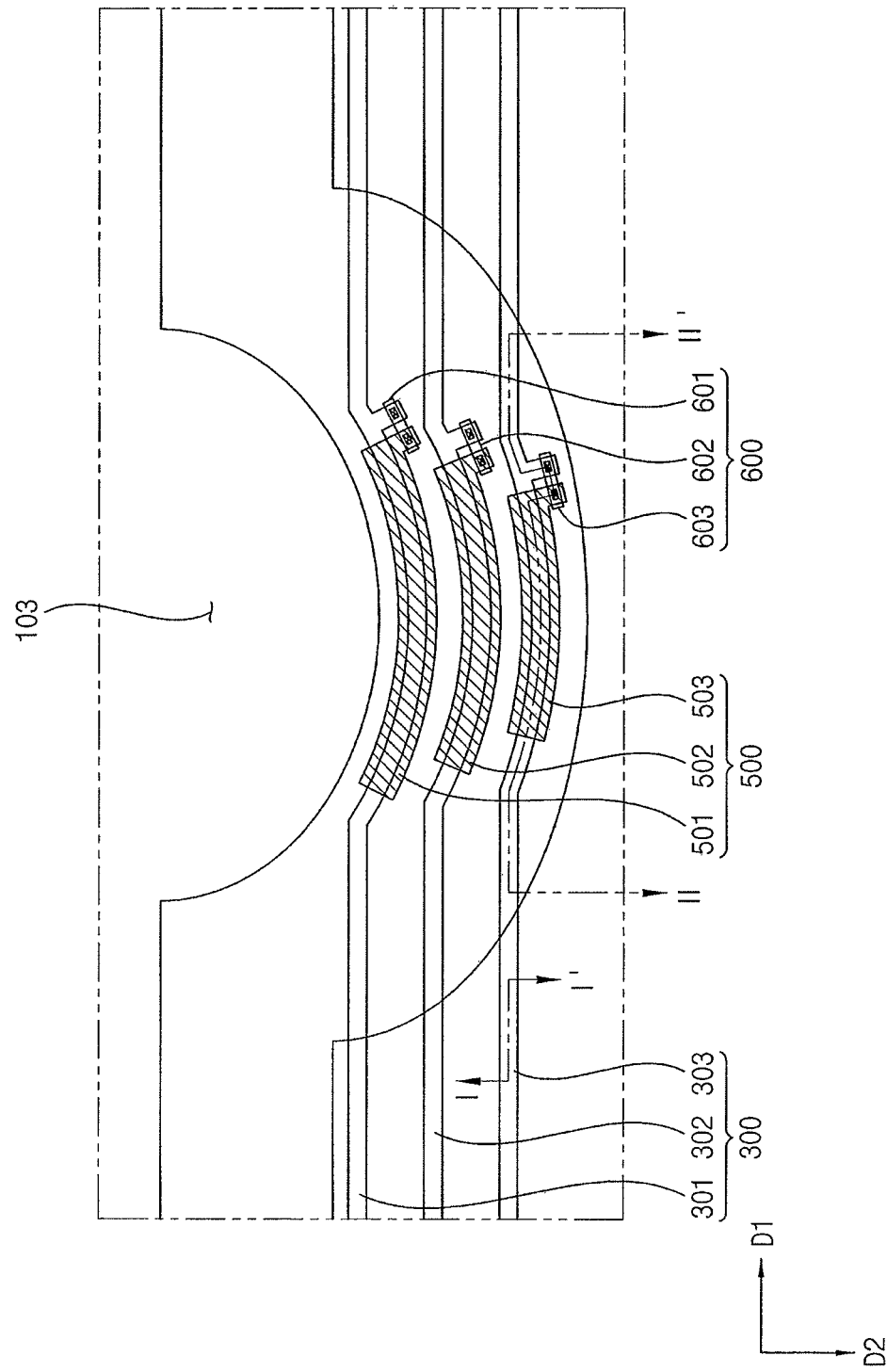
FIG. 4 illustrates a partially enlarged plan view of a stack structure in the OLED display device of FIG. 1.
Figure 5:
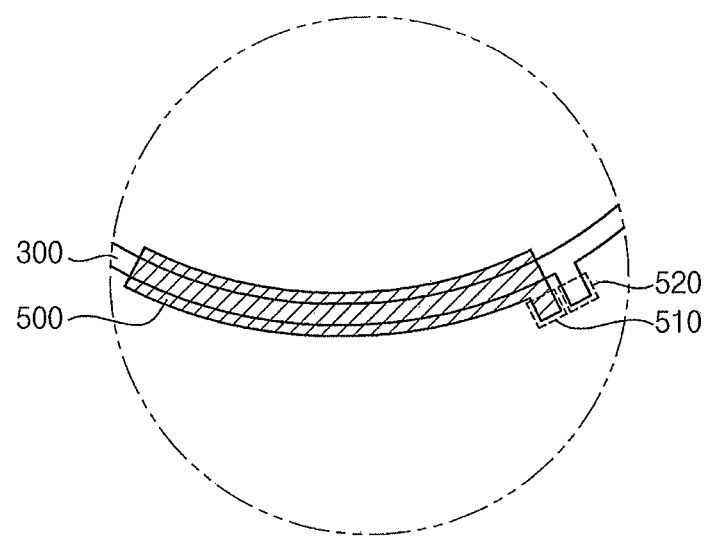
FIG. 5 illustrates a partially enlarged plan view of a pattern protrusion and a wiring protrusion in the stack structure of FIG. 4.

FIG. 4 is a partially enlarged plan view for describing a stack structure included in the OLED display device 100, and FIG. 5 is a partially enlarged plan view for describing a pattern protrusion and a wiring protrusion included in the stack structure of FIG. 4.

Referring to FIGS. 4-5, the OLED display device 100 may include an upper gate wiring 300, an active pattern 500, a connection pattern 600, etc. For example, the upper gate wiring 300, the active pattern 500, and the connection pattern 600 may be disposed on a substrate, which will be described below, included in the OLED display device 100.

The active pattern 500 may be disposed along a profile of the trench 103 in the peripheral region 40 (e.g., the fourth peripheral region 24) located adjacent to the trench 103. That is, the active pattern 500 may have a shape of a curve in the fourth peripheral region 24, e.g., the active pattern 500 may trace and have a same curvature as the fourth peripheral region 24. For example, the active pattern 500 may include a first active pattern 501, a second active pattern 502, and a third active pattern 503. The active pattern 500 may be disposed in the fourth peripheral region 24 on the substrate. For example, the first active pattern 501 may be disposed at an outmost, i.e., outermost, portion of the fourth peripheral region 24, e.g., farthest from the light emitting region 30, and the third active pattern 503 may be disposed at an inside, i.e., innermost, portion of the fourth peripheral region 24, e.g., closest to the light emitting region 30 (or disposed adjacent to the first light emitting region 11). The second active pattern 502 may be disposed between the first active pattern 501 and the third active pattern 503.

In example embodiments, a total distance, i.e., a total length along the first direction D1, of the first active pattern 501 may be greater than a total distance of the second active pattern 502, and the total distance of the second active pattern 502 may be greater than a total distance of the third active pattern 503. In other words, a total distance of each of the first active pattern 501, the second active pattern 502, and the third active pattern 503 may be sequentially decreased, e.g., as a corresponding curvature tracing the trench 103 may decrease.

As illustrated in FIG. 5, the active pattern 500 may have a pattern protrusion 510. The pattern protrusion 510 may protrude from the active pattern 500 in a direction that is different from a longitudinal direction of the active pattern 500. The pattern protrusion 510 may be formed in each of the first active pattern 501, the second active pattern 502, and the third active pattern 503, as illustrated in FIG. 4.

In other words, the active pattern 500 may include first through (N)th active patterns, where N is an integer greater than 1, and the first through (N)th active patterns may be disposed in the fourth peripheral region 24. The first active pattern among the first through (N)th active patterns may be disposed at an outermost portion of the fourth peripheral region 24, and the (N)th active pattern among the first through (N)th active patterns may be disposed at an inside portion of the fourth peripheral region 24 (disposed adjacent to the first light emitting region 11). A distance (e.g. a total distance) of the (K)th active pattern among the first through (N)th active patterns may be greater than a distance of the (K+1)th active pattern among the first through (N)th active patterns, where K is an integer between 1 and N.

The upper gate wiring 300 may be disposed on and overlap the active pattern 500 in the peripheral region 40 (e.g., the fourth peripheral region 24) located adjacent to the trench 103. The upper gate wiring 300 may include the first upper gate wiring 301, the second upper gate wiring 302, and a third upper gate wiring 303. For example, the first upper gate wiring 301 may be disposed on and overlap the first active pattern 501, and the second upper gate wiring 302 may be disposed on and overlap the second active pattern 502. The third upper gate wiring 303 may be disposed on and overlap the third active pattern 503.

In example embodiments, a total area where the first upper gate wiring 301 overlaps the first active pattern 501 may be greater than a total area where the second upper gate wiring 302 overlaps the second active pattern 502. The total area where the second upper gate wiring 302 overlaps the second active pattern 502 may be greater than a total area where the third upper gate wiring 303 overlaps the third active pattern 503. In other words, a total area where the upper gate wiring 300 overlaps the active pattern 500 may be sequentially decreased.

As illustrated in FIG. 5, the upper gate wiring 300 may have a wiring protrusion 520. The wiring protrusion 520 may protrude from the upper gate wiring 300 in a direction that is different from a longitudinal direction of the upper gate wiring 300, and may be located adjacent to the pattern protrusion 510. The wiring protrusion 520 may be formed in each of the first upper gate wiring 301, the second upper gate wiring 302, and the third upper gate wiring 303.

In other words, the upper gate wiring 300 may include first through (M)th upper gate wirings, where M is an integer greater than 1, and the (K)th active pattern among the first through (N)th active patterns may be disposed to overlap the (L)th upper gate wiring among the first through (M)th upper gate wirings, where K is an integer between 1 and N, and L is an integer between 1 and M. For example, as illustrated in FIG. 5, the pattern protrusion 510 and the wiring protrusion 520 may extend in a same direction relatively to the trench 103 and in parallel to each other, e.g., both the pattern protrusion 510 and the wiring protrusion 520 may extend away from the trench 103.

The connection pattern 600 may be disposed on and overlap the pattern protrusion 510 and the wiring protrusion 520, and may electrically connect the pattern protrusion 510 and the wiring protrusion 520 through a contact hole. The connection pattern 600 may include a first connection pattern 601, a second connection pattern 602, and a third connection pattern 603. For example, the first connection pattern 601 may be disposed on and overlap the pattern protrusion of the first active pattern 501 and the wiring protrusion of the first upper gate wiring 301, and the second connection pattern 602 may be disposed on and overlap the pattern protrusion of the second active pattern 502 and the wiring protrusion of the second upper gate wiring 302. The third connection pattern 603 may be disposed on and overlap the pattern protrusion of the third active pattern 503 and the wiring protrusion of the third upper gate wiring 303.

In example embodiments, the connection pattern 600 together with the active pattern 500 and the upper gate wiring 300 overlapping the active pattern 500 may be defined as the stack structure. For example, the first active pattern 501, the first upper gate wiring 301 overlapping the first active pattern 501, and the first connection pattern 601 may be defined as a first stack structure, and the second active pattern 502, the second upper gate wiring 302 overlapping the second active pattern 502, and the second connection pattern 602 may be defined as a second stack structure. The third active pattern 503, the third upper gate wiring 303 overlapping the third active pattern 503, and the third connection pattern 603 may be defined as third stack structure. The stack structure may form a parasitic capacitor between the active pattern 500 and the upper gate wiring 300, and a difference of the load capacitance between the lower gate wiring disposed in the first light emitting region 11 and the upper gate wiring 300 may become equal due to the parasitic capacitor.

In detail, as described above, the first upper gate wiring 301 may be connected to the smallest number of the light emitting structure 200. To equalize a difference between a load capacitance of the lower gate wiring disposed in the first light emitting region 11 and a load capacitance of the first upper gate wiring 301, a total area where the first upper gate wiring 301 overlaps the first active pattern 501 may be the largest. Compared to the first upper gate wiring 301, an area where the second upper gate wiring 302 overlaps the second active pattern 502 may be less than an area where the first upper gate wiring 301 overlaps the first active pattern 501 so as to equalize a difference of a load capacitance between the first upper gate wiring 301 and the second upper gate wiring 302 because the second upper gate wiring 302 is connected to the relatively large number of the light emitting structure 200. Similarly, compared to the second upper gate wiring 302, an area where the third upper gate wiring 303 overlaps the third active pattern 503 may be less than an area where the second upper gate wiring 302 overlaps the second active pattern 502 so as to equalize a difference of a load capacitance between the second upper gate wiring 302 and the third upper gate wiring 303 because the third upper gate wiring 303 is connected to a relatively large number of the light emitting structure 200. Accordingly, a luminance difference may not occur between the first light emitting region 11 and the second and third light emitting regions 12 and 13, and therefore, a visibility of the OLED display device 100 may be relatively increased.

In example embodiments, the OLED display device 100 may include three stack structures including three active patterns 500, three upper gate wirings 300, and three connection patterns 600, but is not limited thereto. For example, in some example embodiments, the OLED display device 100 may include at least four stack structures including at least four active patterns 500, at least four upper gate wirings 300, and at least four connection patterns 600.

Figure 6:
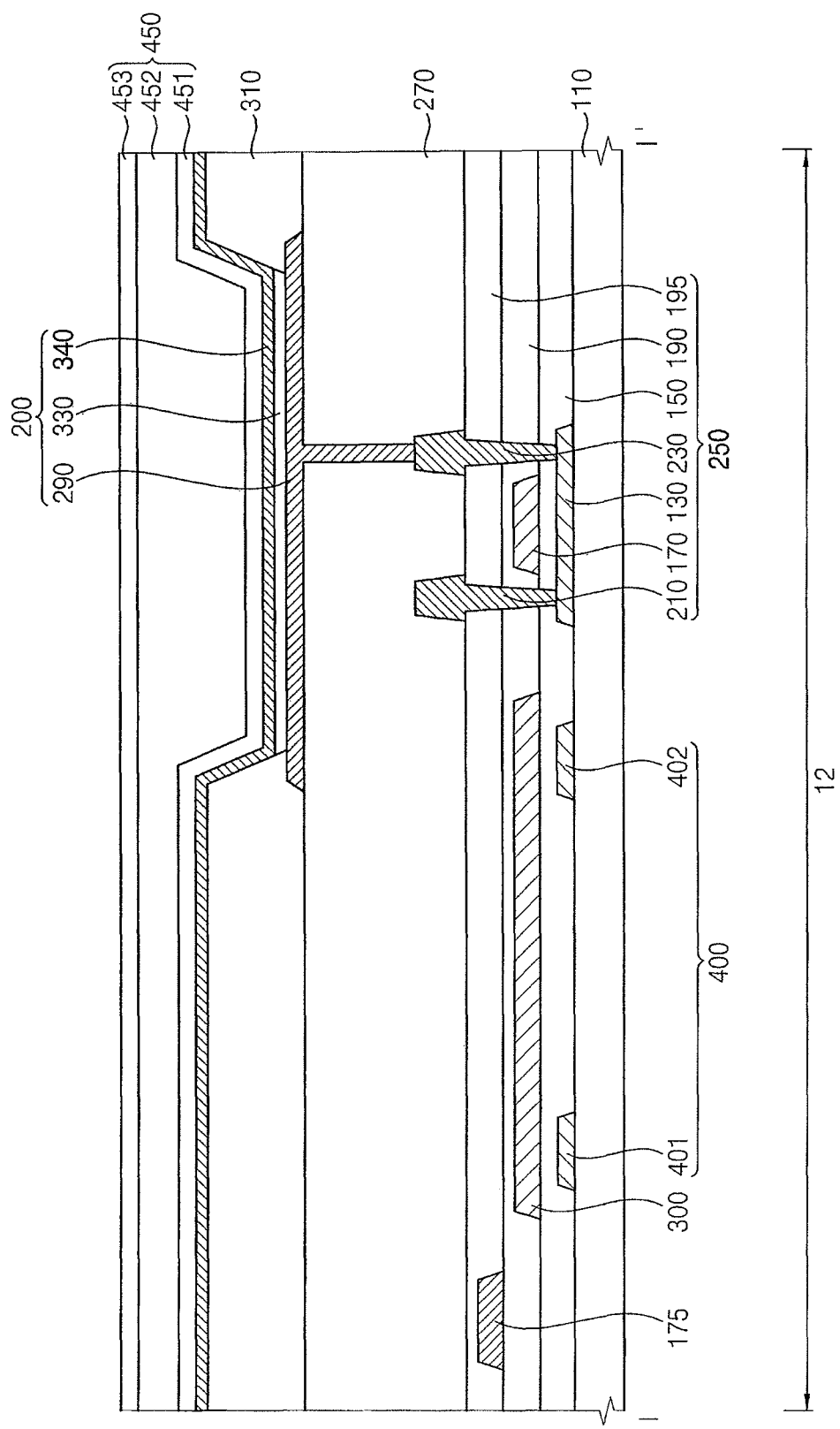
FIG. 6 illustrates a cross-sectional view along line I-I' of FIG. 4.
Figure 7:
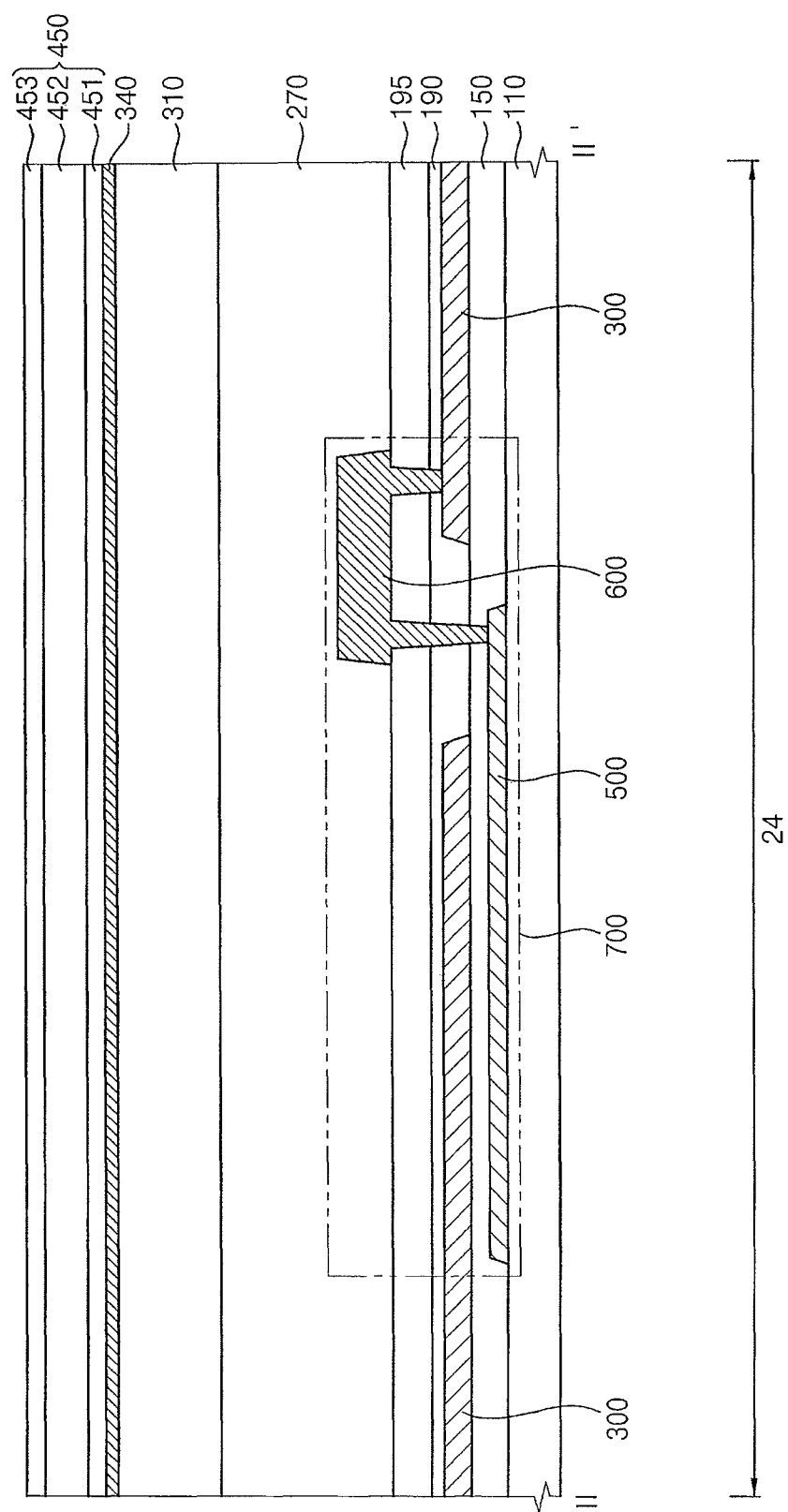
FIG. 7 illustrates a cross-sectional view along line II-II' of FIG. 4.
Figure 8:
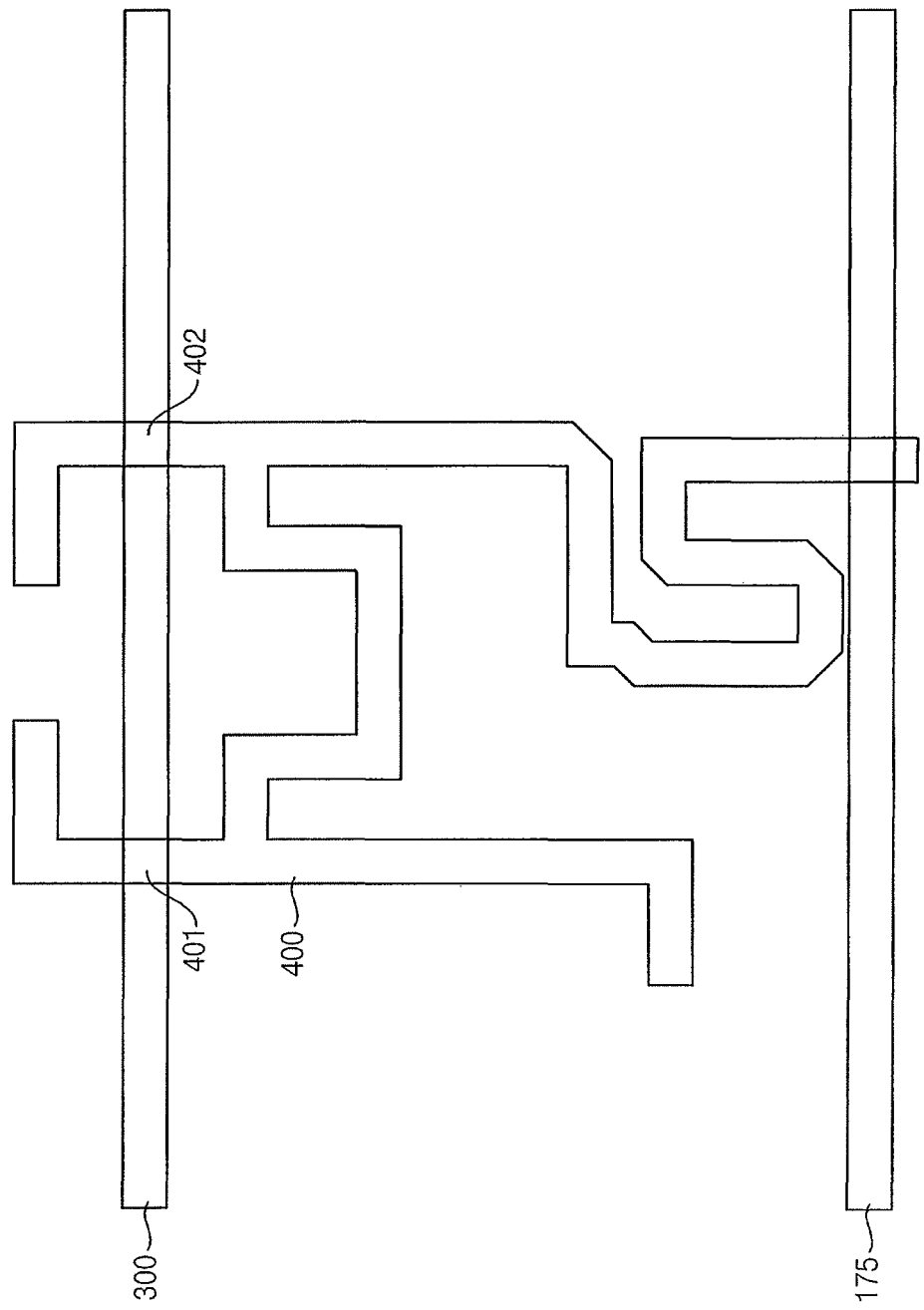
FIG. 8 illustrates a plan view of an active wiring in the OLED display device of FIG. 6.

FIG. 6 is a cross-sectional view taken along line I-I' of FIG. 4 (i.e., second light emitting region 12), and FIG. 7 is a cross-sectional view taken along line II-II' of FIG. 4 (i.e., fourth peripheral region 24). FIG. 8 is a plan view for describing the active wiring included in the OLED display device of FIG. 6.

Referring to FIGS. 5, 6, 7, and 8, the OLED display device 100 may include a substrate 110, a semiconductor element 250, an active wiring 400, the active pattern 500 (e.g., the third active pattern 503 of FIG. 4), the upper gate wiring 300 (e.g., the third upper gate wiring 303 of FIG. 4), a signal wiring 175, the connection pattern 600 (e.g., the third connection pattern 603 of FIG. 4), a planarization layer 270, the light emitting structure 200, a pixel defining layer 310, a thin film encapsulation structure ("TFE") 450, etc. Here, the light emitting structure 200 may include a lower electrode 290, a light emitting layer 330, and an upper electrode 340, and the semiconductor element 250 may include an active layer 130, a gate insulation layer 150, a gate electrode 170, a first insulating interlayer 190, a second insulating interlayer 195, a source electrode 210, and a drain electrode 230. In addition, the TFE structure 450 may include a first TFE layer 451, a second TFE layer 452, and a third TFE layer 453.

The substrate 110 including transparent or opaque materials may be provided. The substrate 110 may include a flexible transparent material such as a flexible transparent resin substrate (e.g., a polyimide substrate). In example embodiments, the substrate 110 may have a configuration where a first organic layer, a first barrier layer, a second organic layer, and a second barrier layer sequentially are stacked. The first and second barrier layers may include inorganic materials, e.g., silicon oxide, and may block water or moisture permeating through the first and second organic layers. In addition, the first and second organic layers may include organic materials, e.g., polyimide-based resin.

In a method of manufacturing the substrate 110, since the substrate 110 is relatively thin and flexible, the substrate 110 may be formed on a rigid glass substrate to help support formation of the semiconductor element 250 and the light emitting structure 200. For example, after a buffer layer is provided on the second barrier layer, the semiconductor element 250 and the light emitting structure 200 may be formed on the buffer layer. After the semiconductor element 250 and the light emitting structure 200 are formed on the buffer layer, the rigid glass substrate, on which the substrate 110 is formed, may be removed. In other words, it may be difficult to directly form the semiconductor element 250 and the light emitting structure 200 on the substrate 110 because the substrate 110 is relatively thin and flexible. Accordingly, the semiconductor element 250 and the light emitting structure 200 are formed on the substrate 110 and the rigid glass substrate, and then the first organic layer, the first barrier layer, the second organic layer, and the second barrier layer may serve as the substrate 110 after the removal of the rigid glass substrate. Alternatively, the substrate 110 may include, e.g., a quartz substrate, a synthetic quartz substrate, a calcium fluoride substrate, a fluoride-doped quartz substrate, a soda-lime glass substrate, a non-alkali glass substrate etc.

In example embodiments, the substrate 110 may have four layers, but is not limited thereto. For example, in some example embodiments, the substrate 110 may have a single layer or a plurality of layers.

As the OLED display device 100 has the display region 10, including the light emitting region 30 and the peripheral region 40, and the pad region 20, the substrate 110 may be divided as the display region 10, including the light emitting region 30 and the peripheral region 40, and the pad region 20. In addition, the light emitting region 30 may be divided as the first light emitting region 11, the second light emitting region 12, and the third light emitting region 13, and the peripheral region 40 may be divided as the first peripheral region 21, the second peripheral region 22, the third peripheral region 23, and the fourth peripheral region 24.

A buffer layer may be disposed on the substrate 110. The buffer layer may be disposed on the entire substrate 110. The buffer layer may prevent the diffusion of metal atoms and/or impurities from the substrate 110 into the semiconductor element 250 and the light emitting structure 200. In addition, the buffer layer may control a rate of a heat transfer in a crystallization process for forming the active layer 130, thereby obtaining substantially uniform the active layer 130. Further, the buffer layer may improve a surface flatness of the substrate 110 when a surface of the substrate 110 is relatively irregular. According to a type of the substrate 110, at least two buffer layers may be provided on the substrate 110, or the buffer layer might not be disposed. For example, the buffer layer may include organic materials or inorganic materials.

The active layer 130 may be disposed in the second light emitting region 12 on the substrate 110. For example, the active layer 130 may include an oxide semiconductor, an inorganic semiconductor (e.g., amorphous silicon, polysilicon, etc.), an organic semiconductor, etc.

The active wiring 400 may be disposed in the second light emitting region 12 on the substrate 110, and may be spaced apart from the active layer 130, e.g., along the first direction D1. For example, the active wiring 400 may have a shape, which is illustrated in FIG. 8, in the second light emitting region 12. Here, overlapping portions 401 and 402, where the upper gate wiring 300 overlaps the active wiring 400, may be illustrated in FIG. 6. The overlapping portions 401 and 402 of the active wiring 400 may correspond to active layers of semiconductor elements that are different from the semiconductor element 250. In addition, a portion where the active layer 130 overlaps the gate electrode 170 may correspond to a portion where a gate wiring that is different from the upper gate wiring 300 overlaps the active wiring 400. For convenience of descriptions, not all of the wirings included in the OLED display device 100 are illustrated in FIG. 8. For example, the OLED display device 100 may further include first and second gate signal wirings, a data signal wiring, a light emission signal wiring, a power supply voltage wiring, etc.

The active pattern 500 may be disposed in the fourth peripheral region 24 on the substrate 110. The active pattern 500 may be disposed along a profile of the trench 103 in the fourth peripheral region 24 located adjacent to the trench 103 (refer to FIG. 4). That is, the active pattern 500 may have a shape of a curve in the fourth peripheral region 24. The active pattern 500 may have the pattern protrusion 510. The pattern protrusion 510 may protrude from the active pattern 500 in a direction that is different from a longitudinal direction. The active wiring 400 and the active pattern 500 may be disposed at a same layer, and may be simultaneously (or concurrently) formed using same materials.

The gate insulation layer 150 may be disposed on the active layer 130, the active wiring 400, and the active pattern 500. The gate insulation layer 150 may cover the active layer 130, the active wiring 400, and the active pattern 500 in the second light emitting region 12 and the fourth peripheral region 24 on the substrate 110, and may be disposed on the entire substrate 110. For example, the gate insulation layer 150 may sufficiently cover the active layer 130, the active wiring 400, and the active pattern 500 on the substrate 110, and may have a substantially flat upper surface without a step around the active layer 130, the active wiring 400, and the active pattern 500. Alternatively, the gate insulation layer 150 may cover the active layer 130, the active wiring 400, and the active pattern 500 on the substrate 110, and may be disposed as a substantially uniform thickness along a profile of the active layer 130, the active wiring 400, and the active pattern 500. The gate insulation layer 150 may include silicon compound, metal oxide, etc. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc.

The gate electrode 170 may be disposed in the second light emitting region 12 on the gate insulation layer 150. In other words, the gate electrode 170 may be disposed on a portion of the gate insulation layer 150 under which the active layer 130 is located. The gate electrode 170 may include, e.g., a metal, a metal alloy, metal nitride, conductive metal oxide, transparent conductive materials, etc. These may be used alone or in a suitable combination thereof. Alternatively, the gate electrode 170 may have a multi-layered structure including a plurality of layers.

The upper gate wiring 300 may be disposed in the second light emitting region 12 and the fourth peripheral region 24 on the gate insulation layer 150, and may be spaced apart from the gate electrode 170. For example, the upper gate wiring 300 may have a shape, which is illustrated in FIG. 8, in the second light emitting region 12. A load capacitance may be generated in the overlapping portions 401 and 402 where the upper gate wiring 300 overlaps the active wiring 400.

As described above, since the first upper gate wiring 301 and the second upper gate wiring 302 is not connected to the light emitting structures 200 in the fourth peripheral region 24, the first upper gate wiring 301 and the second upper gate wiring 302 may be connected to a relatively smaller number of the light emitting structures 200 than the first lower gate wiring 305 and the second lower gate wiring 306 (refer to FIG. 3). That is, the overlapping portions 401 and 402, where the upper gate wiring 300 overlaps the active wiring 400, may be relatively less in the upper gate wiring 300. Accordingly, a potential difference of the load capacitance between the first light emitting region 11 and the second and third light emitting regions 12 and 13 may be equalized via a parasitic capacitor, i.e., the upper gate wiring 300 over-lapping the active pattern 500 in the fourth peripheral region 24 (FIG. 7), so the difference of the load capacitance between the lower and upper gate wirings disposed in the first light emitting region 11 and the second and third light emitting regions 12 and 13 may become equal.

The upper gate wiring 300 may include a metal, an alloy of a metal, metal nitride, conductive metal oxide, transparent conductive materials, etc. For example, the upper gate wiring 300 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride ($AlN_x$), an alloy of silver, tungsten nitride ($WN_x$), an alloy of copper, an alloy of molybdenum, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in a suitable combination thereof. Alternatively, the upper gate wiring 300 may have a multi-layered structure including a plurality of layers. In example embodiments, the gate electrode 170 and the upper gate wiring 300 may be disposed at a same layer, and may be simultaneously formed using same materials.

The first insulating interlayer 190 may be disposed on the upper gate wiring 300 and the gate electrode 170. The first insulating interlayer 190 may cover the upper gate wiring 300 and the gate electrode 170 in the second light emitting region 12 and the fourth peripheral region 24 on the gate insulation layer 150, and may be disposed on the entire gate insulation layer 150. For example, the first insulating interlayer 190 may sufficiently cover the upper gate wiring 300 and the gate electrode 170 in the second light emitting region 12 and the fourth peripheral region 24 on the gate insulation layer 150, and may have a substantially flat upper surface without a step around the upper gate wiring 300 and the gate electrode 170. Alternatively, the first insulating interlayer 190 may cover the upper gate wiring 300 and the gate electrode 170 in the second light emitting region 12 and the fourth peripheral region 24 on the gate insulation layer 150, and may be disposed as a substantially uniform thickness along a profile of the upper gate wiring 300 and the gate electrode 170. The first insulating interlayer 190 may include, e.g., silicon compound, metal oxide, etc.

The signal wiring 175 may be disposed in the second light emitting region 12 on the first insulating interlayer 190. For example, the signal wiring 175 may be spaced apart from the upper gate wiring 300, and may be disposed in the second light emitting region 12, the third light emitting region 13, and the fourth peripheral region 24. In example embodiments, the signal wiring 175 may correspond to an initialization signal wiring. For example, the signal wiring 175 may have a shape, which is illustrated in FIG. 8, in the second light emitting region 12. The signal wiring 175 may include, e.g., a metal, an alloy of a metal, metal nitride, conductive metal oxide, transparent conductive materials, etc. These may be used alone or in a suitable combination thereof. Alternatively, the signal wiring 175 may have a multi-layered structure including a plurality of layers.

The second insulating interlayer 195 may be disposed on the signal wiring 175. The second insulating interlayer 195 may cover the signal wiring 175 in the second light emitting region 12 and the fourth peripheral region 24 on the first insulating interlayer 190, and may be disposed on the entire first insulating interlayer 190. For example, the second insulating interlayer 195 may sufficiently cover the signal wiring 175 in the second light emitting region 12 and the fourth peripheral region 24 on the first insulating interlayer 190, and may have a substantially flat upper surface without a step around the signal wiring 175. Alternatively, the second insulating interlayer 195 may cover the signal wiring 175 in the second light emitting region 12 and the fourth peripheral region 24 on the first insulating interlayer 190, and may be disposed as a substantially uniform thickness along a profile of the signal wiring 175. The second insulating interlayer 195 may include silicon compound, metal oxide, etc.

The source electrode 210 and the drain electrode 230 may be disposed in the second light emitting region 12 on the second insulating interlayer 195. The source electrode 210 may be in direct contact with a first side (e.g., a source region) of the active layer 130 via a contact hole formed by removing a portion of each of the gate insulation layer 150, the first insulating interlayer 190, and the second insulating interlayer 195. The drain electrode 230 may be in direct contact with a second side (e.g., a drain region) of the active layer 130 via a contact hole formed by removing another portion of each of the gate insulation layer 150, the first insulating interlayer 190, and the second insulating interlayer 195. Each of the source electrode 210 and the drain electrode 230 may include, e.g., a metal, an alloy, metal nitride, conductive metal oxide, transparent conductive materials, etc. These may be used alone or in a suitable combination thereof. Alternatively, each of the source and drain electrodes 210 and 230 may have a multi-layered structure including a plurality of layers. Accordingly, the semiconductor element 250 including the active layer 130, the gate insulation layer 150, the gate electrode 170, the first insulating interlayer 190, the second insulating interlayer 195, the source electrode 210, and the drain electrode 230 may be constituted.

In example embodiments, the OLED display device 100 has a configuration including one transistor (e.g., the semiconductor element 250), but is not limited thereto. For example, the OLED display device 100 may have a configuration including at least two transistors and at least one capacitor.

In addition, the semiconductor element 250 has a top gate structure, but is not limited thereto. For example, the semiconductor element 250 may have a bottom gate structure and/or double gate structure.

The connection pattern 600 may be disposed in the fourth peripheral region 24 on the second insulating interlayer 195. The connection pattern 600 may be disposed on and overlap a portion of the active pattern 500 (i.e., the pattern protrusion 510 in FIGS. 4-5) and a portion of the upper gate wiring 300 (i.e., the wiring protrusion 520 in FIGS. 4-5), and may electrically connect the pattern protrusion 510 and the wiring protrusion 520 through a contact hole. The connection pattern 600 may include, e.g., a metal, an alloy, metal nitride, conductive metal oxide, transparent conductive materials, etc. These may be used alone or in a suitable combination thereof. Alternatively, the connection pattern 600 may have a multi-layered structure including a plurality of layers. In example embodiments, the source electrode 210, the drain electrode 230, and the connection pattern 600 may be simultaneously formed using same materials. Accordingly, a stack structure 700 including the active pattern 500, the upper gate wiring 300 overlapping the active pattern 500, and the connection pattern 600 may be disposed (framed with a dashed line in FIG. 7). The stack structure 700 may form the parasitic capacitor between the active pattern 500 and the upper gate wiring 300, so the difference of the load capacitance between the lower gate wiring disposed in the first light emitting region 11 and the upper gate wiring 300 may become equal due to the parasitic capacitor.

The planarization layer 270 may be disposed on the second insulating interlayer 195, the connection pattern 600, the source electrode 210, and the drain electrode 230, and may have a contact hole that exposes a portion of the semiconductor element 250. The planarization layer 270 may be disposed at a high thickness to sufficiently cover the connection pattern 600 and the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In example embodiments, the planarization layer 270 may include organic materials. For example, the planarization layer 270 may include a polyimide-based resin, a photoresist, an acryl-based resin, a polyamide-based resin, a siloxane-based resin, etc.

The lower electrode 290 may be disposed in the second light emitting region 12 on the planarization layer 270. The lower electrode 290 may be in direct contact with the drain electrode 230 via the contact hole of the planarization layer 270, and may be electrically connected to the semiconductor element 250. The lower electrode 290 may include, e.g., a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The pixel defining layer 310 may be disposed on a portion of the lower electrode 290 and the planarization layer 270. The pixel defining layer 310 may cover both lateral portions of the lower electrode 290, and may have an opening that exposes a portion of an upper surface of the lower electrode 290. The pixel defining layer 310 may include organic materials or inorganic materials. In example embodiments, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light (e.g., a red color of light, a blue color of light, and a green color of light) according to sub-pixels. Alternatively, the light emitting layer 330 may generally generate a white color of light by stacking a plurality of light emitting materials capable of generating different colors of light such as a red color of light, a green color of light, and a blue color of light. In this case, a color filter may be disposed on the light emitting layer 330 (e.g., the color filter overlaps the light emitting layer 330, and is disposed on lower or upper surfaces of the TFE structure 450). The color filter may include at least one selected from a red color filter, a green color filter, and a blue color filter. Alternatively, the color filter may include a yellow color filter, a cyan color filter, and a magenta color filter. The color filter may include a photosensitive resin, a color photoresist, etc.

The upper electrode 340 may be disposed on the pixel defining layer 310 and the light emitting layer 330. The upper electrode 340 may cover the light emitting layer 330 and the pixel defining layer 310, and may be disposed on the entire substrate 110. The upper electrode 340 may include, e.g., a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, the light emitting structure 200 including the lower electrode 290, the light emitting layer 330, and the upper electrode 340 may be disposed.

The first TFE layer 451 may be disposed on the upper electrode 340. The first TFE layer 451 may cover the upper electrode 340, and may be disposed at a substantially uniform thickness along a profile of the upper electrode 340. The first TFE layer 451 may prevent the light emitting structure 200 from being deteriorated by the permeation of, e.g., moisture, water, oxygen, etc. In addition, the first TFE layer 451 may protect the light emitting structure 200 from external impacts. The first TFE layer 451 may include inorganic materials having flexibility.

The second TFE layer 452 may be disposed on the first TFE layer 451. The second TFE layer 452 may improve the flatness of the OLED display device 100, and may protect the light emitting structure 200. The second TFE layer 452 may include organic materials having flexibility.

The third TFE layer 453 may be disposed on the second TFE layer 452. The third TFE layer 453 may cover the second TFE layer 452, and may be disposed at a substantially uniform thickness along a profile of the second TFE layer 452. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer 451 and the second TFE layer 452 may protect the light emitting structure 200 from external impacts. The third TFE layer 453 may include inorganic materials having flexibility. Accordingly, the TFE structure 450 including the first TFE layer 451, the second TFE layer 452, and the third TFE layer 453 may be disposed. Alternatively, the TFE structure 450 may have five layers structure where first through fifth TFE layers are stacked or seven layers structure where the first through seventh TFE layers are stacked.

As the OLED display device 100 in accordance with example embodiments includes the stack structure 700 disposed in the fourth peripheral region 24, a difference of a load capacitance between lower and upper gate wirings disposed in the first light emitting region 11 and the second and third light emitting regions 12 and 13 may be eliminated or substantially minimized. Accordingly, a luminance difference of the first light emitting region 11 and the second and third light emitting regions 12 and 13 might not occur, and a visibility of the OLED display device 100 may be improved.

FIGS. 9 through 17 are cross-sectional views illustrating stages in a method of manufacturing the OLED display device 100 in accordance with example embodiments.

Figure 9:
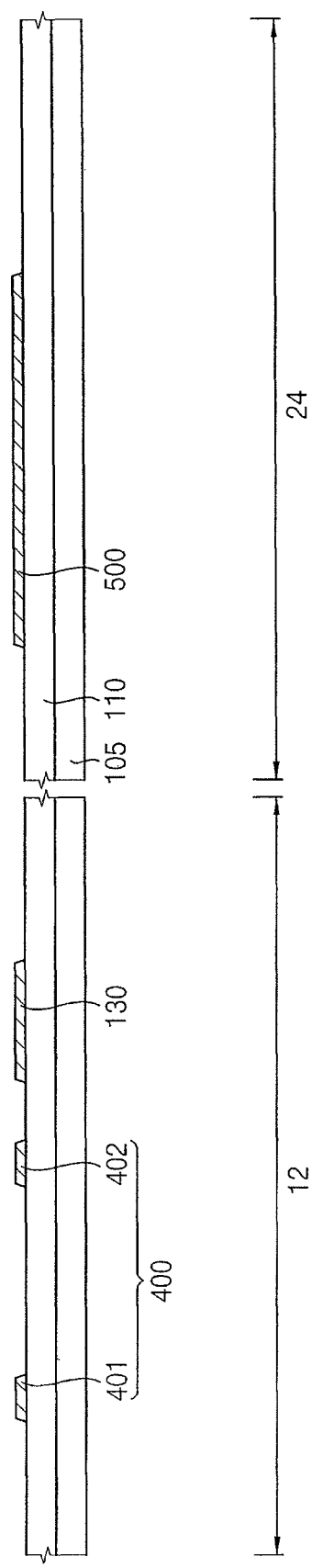
FIGS. 9 through 17 illustrate cross-sectional views of stages in a method of manufacturing an OLED display device in accordance with example embodiments.

Referring to FIG. 9, a rigid glass substrate 105 may be provided. The substrate 110 including transparent or opaque materials may be formed on the rigid glass substrate 105. The substrate 110 may be formed using a flexible transparent material, e.g., a flexible transparent resin substrate. In example embodiments, the substrate 110 may have a configuration where a first organic layer, a first barrier layer, a second organic layer, and a second barrier layer are sequentially stacked. The first and second barrier layers may be formed using inorganic materials, e.g., silicon oxide, and may block water or moisture permeating through the first and second organic layers. In addition, the first and second organic layers may be formed using organic materials, e.g., polyimide-based resin.

As the OLED display device 100 has the display region 10, including the light emitting region 30 and the peripheral region 40, and the pad region 20, the substrate 110 may be divided as the display region 10, including the light emitting region 30 and the peripheral region 40, and the pad region 20. In addition, the light emitting region 30 may be divided as the first light emitting region 11, the second light emitting region 12, and the third light emitting region 13, and the peripheral region 40 may be divided as the first peripheral region 21, the second peripheral region 22, the third peripheral region 23, and the fourth peripheral region 24.

The active layer 130 may be formed in the second light emitting region 12 on the substrate 110. The active wiring 400 may be formed in the second light emitting region 12 on the substrate 110, and may be spaced apart from the active layer 130. The active pattern 500 may be formed in the fourth peripheral region 24 on the substrate 110. The active pattern 500 may be formed along the profile of the trench 103 in the fourth peripheral region 24 located adjacent to the trench 103. That is, the active pattern 500 may have a shape of a curve in the fourth peripheral region 24. The active pattern 500 may have the pattern protrusion 510 (illustrated in FIG. 5). The pattern protrusion 510 may protrude from the active pattern 500 in a direction that is different from a longitudinal direction.

The active layer 130, the active wiring 400, and the active pattern 500 may be formed on a same layer, and may be simultaneously formed using same materials. For example, after a preliminary active layer is formed on the substrate 110, the active layer 130, the active wiring 400, and the active pattern 500 may be formed by partially etching the preliminary active layer. Each of the active layer 130, the active wiring 400, and the active pattern 500 may be formed using, e.g., oxide semiconductor, an inorganic semiconductor, an organic semiconductor, etc.

Figure 10:
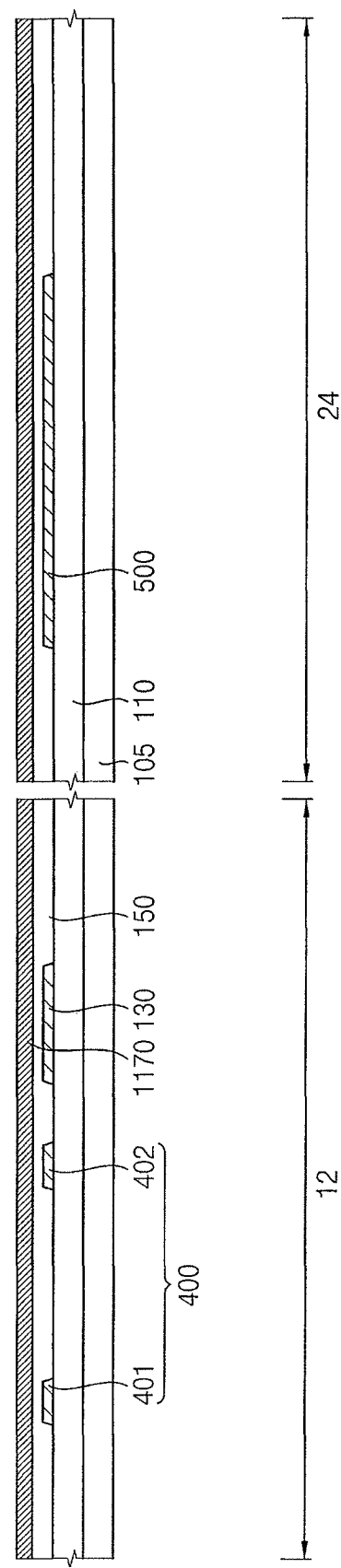

Referring to FIG. 10, the gate insulation layer 150 may be formed on the active layer 130, the active wiring 400, and the active pattern 500. The gate insulation layer 150 may cover the active layer 130, the active wiring 400, and the active pattern 500 in the second light emitting region 12 and the fourth peripheral region 24 on the substrate 110, and may be formed on the entire substrate 110. For example, the gate insulation layer 150 may sufficiently cover the active layer 130, the active wiring 400, and the active pattern 500 on the substrate 110, and may have a substantially flat upper surface without a step around the active layer 130, the active wiring 400, and the active pattern 500. Alternatively, the gate insulation layer 150 may cover the active layer 130, the active wiring 400, and the active pattern 500 on the substrate 110, and may be formed as a substantially uniform thickness along a profile of the active layer 130, the active wiring 400, and the active pattern 500. The gate insulation layer 150 may be formed using silicon compound, metal oxide, etc. For example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

A preliminary gate electrode layer 1170 may be formed on the entire gate insulation layer 150. The preliminary gate electrode layer 1170 may be formed using, e.g., a metal, a metal alloy, metal nitride, conductive metal oxide, transparent conductive materials, etc. For example, the preliminary gate electrode layer 1170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, $WN_x$, an alloy of copper, an alloy of molybdenum, $TiN_x$, $CrN_x$, $TaN_x$, $SrRu_xO_y$, $ZnO_x$, ITO, $SnO_x$, $InO_x$, $GaO_x$, IZO, etc. These may be used alone or in a suitable combination thereof. Alternatively, the preliminary gate electrode layer 1170 may have a multi-layered structure including a plurality of layers.

A first etch process, in which the preliminary gate electrode layer 1170 is partially etched, may be performed after the preliminary gate electrode layer 1170 is formed on the gate insulation layer 150. For example, the first etch process may correspond to a dry etch process, i.e., where the preliminary gate electrode layer 1170 is etched using a plasma. While the first etch process is performed, static electricity may be generated, and the static electricity may flow into the preliminary gate electrode layer 1170.

In a comparative OLED display device, when static electricity flows into the preliminary gate electrode layer, the amount of coupling between the preliminary gate electrode layer and the active wiring may be different from each other because a load capacitance of the preliminary gate electrode layer disposed in a first light emitting region and the second and third light emitting regions and may be different from each other. In this case, a characteristic of a semiconductor element disposed the first light emitting region may be different from a characteristic of a semiconductor element disposed the second and third light emitting regions and, and a difference of luminance may occur in the first light emitting region and the second and third light emitting regions and.

In example embodiments, as the preliminary gate electrode layer 1170 overlaps the active pattern 500 in the fourth peripheral region 24, a parasitic capacitor may be formed, and a load capacitance of the preliminary gate electrode layer 1170 disposed in the first light emitting region 11 and the second and third light emitting regions 12 and 13 may become equal. In this case, a difference of the amount of coupling between the preliminary gate electrode layer 1170 and the active wiring 400 may be minimized in each of the first light emitting region 11 and the second and third light emitting regions 12 and 13. Thus, although static electricity flows into the preliminary gate electrode layer 1170, a semiconductor element formed in the first light emitting region 11 and a semiconductor element formed in the second and third light emitting regions 12 and 13 may be relatively less influenced by the static electricity.

Figure 11:
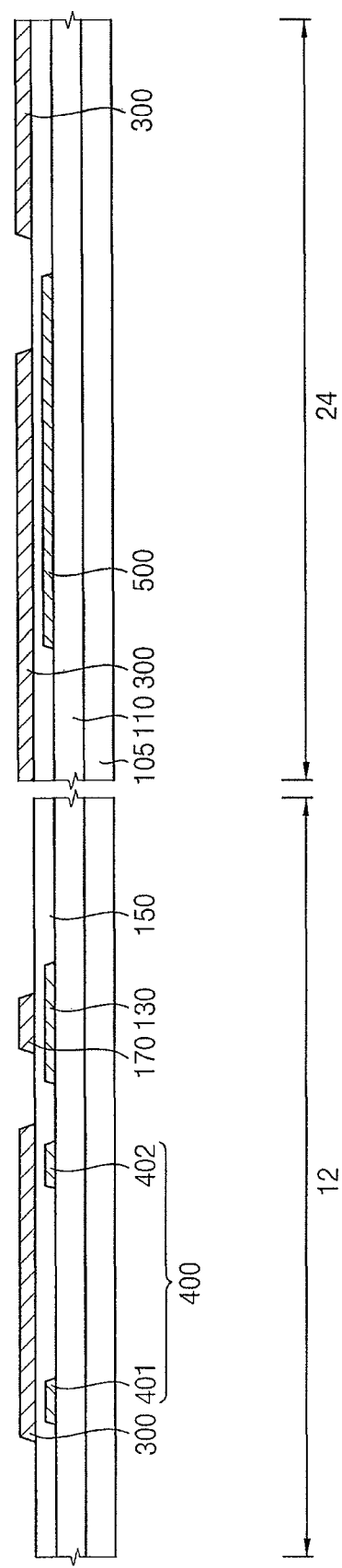

Referring to FIG. 11, after the first etch process is performed, the upper gate wiring 300 and the gate electrode 170 may be formed on the gate insulation layer 150. The gate electrode 170 may be disposed in the second light emitting region 12 on the gate insulation layer 150, and may be formed on a portion of the gate insulation layer 150 under which the active layer 130 is located. The upper gate wiring 300 may be formed in the second light emitting region 12 and the fourth peripheral region 24 on the gate insulation layer 150, and may be spaced apart from the gate electrode 170. In example embodiments, the gate electrode 170 and the upper gate wiring 300 may be formed at a same layer, and may be simultaneously formed using same materials.

Figure 12:
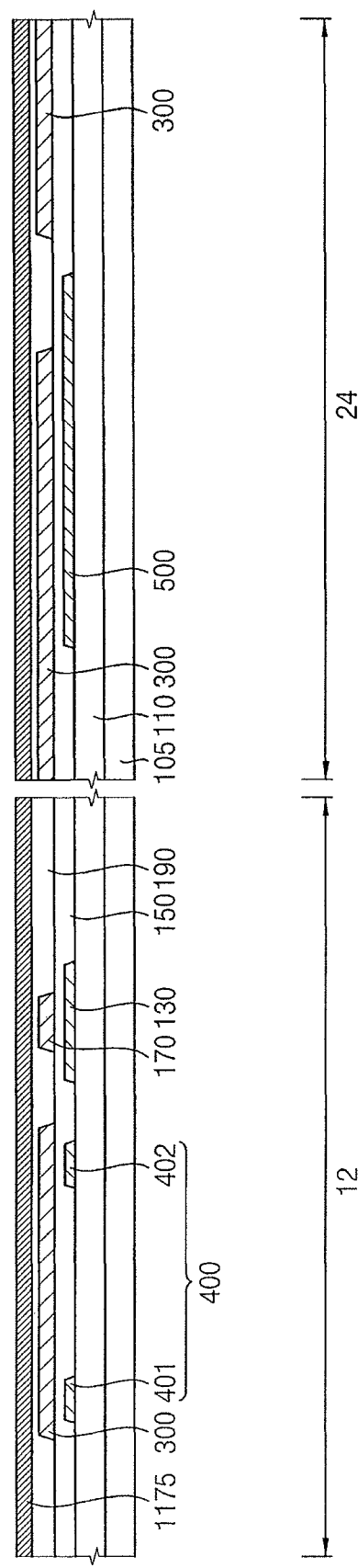

Referring to FIG. 12, the first insulating interlayer 190 may be formed on the upper gate wiring 300 and the gate electrode 170. The first insulating interlayer 190 may cover the upper gate wiring 300 and the gate electrode 170 in the second light emitting region 12 and the fourth peripheral region 24 on the gate insulation layer 150, and may be formed on the entire gate insulation layer 150. For example, the first insulating interlayer 190 may sufficiently cover the upper gate wiring 300 and the gate electrode 170 in the second light emitting region 12 and the fourth peripheral region 24 on the gate insulation layer 150, and may have a substantially flat upper surface without a step around the upper gate wiring 300 and the gate electrode 170. Alternatively, the first insulating interlayer 190 may cover the upper gate wiring 300 and the gate electrode 170 in the second light emitting region 12 and the fourth peripheral region 24 on the gate insulation layer 150, and may be formed as a substantially uniform thickness along a profile of the upper gate wiring 300 and the gate electrode 170. The first insulating interlayer 190 may be formed using silicon compound, metal oxide, etc.

A preliminary electrode layer 1175 may be formed on the entire first insulating interlayer 190. The preliminary electrode layer 1175 may be formed using, e.g., a metal, a metal alloy, metal nitride, conductive metal oxide, transparent conductive materials, etc. These may be used alone or in a suitable combination thereof. Alternatively, the preliminary electrode layer 1175 may have a multi-layered structure including a plurality of layers.

A second etch process, in which the preliminary electrode layer 1175 is partially etched, may be performed after the preliminary electrode layer 1175 is formed on the first insulating interlayer 190. For example, the second etch process may correspond to a dry etch process where the preliminary electrode layer 1175 is etched using a plasma. While the second etch process is performed, static electricity may be generated, and the static electricity may flow into the preliminary electrode layer 1175.

In example embodiments, as the upper gate wiring 300 overlaps the active pattern 500 in the fourth peripheral region 24, a parasitic capacitor may be formed, and a difference of the amount of coupling between the preliminary electrode layer 1175 and a gate wiring may be minimized in each of the first light emitting region 11 and the second and third light emitting regions 12 and 13. Thus, although the static electricity flows into the preliminary electrode layer 1175, a semiconductor element formed in the first light emitting region 11 and a semiconductor element formed in the second and third light emitting regions 12 and 13 may be relatively less influenced by the static electricity.

Figure 13:
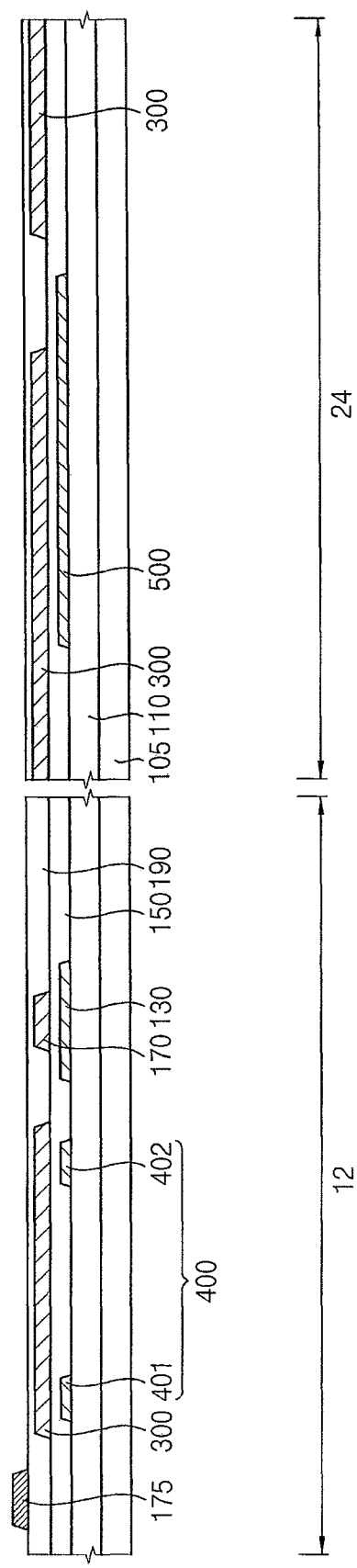

Referring to FIG. 13, the signal wiring 175 may be formed in the second light emitting region 12 on the first insulating interlayer 190. The signal wiring 175 may be spaced apart from the upper gate wiring 300, and may be formed in the second light emitting region 12, the third light emitting region 13, and the fourth peripheral region 24. In example embodiments, the signal wiring 175 may correspond to an initialization signal wiring.

Figure 14:
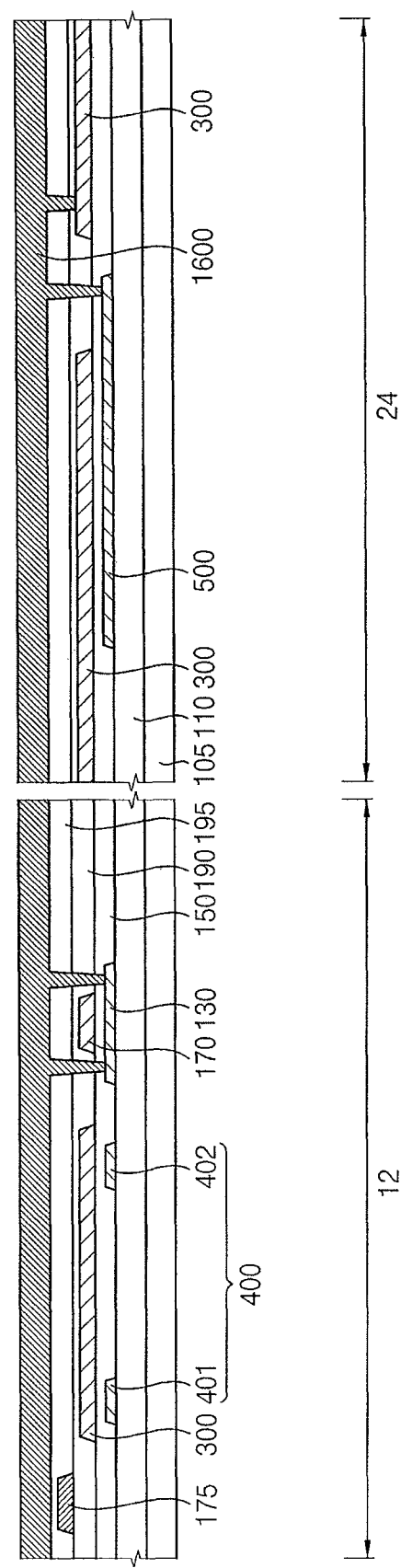

Referring to FIG. 14, the second insulating interlayer 195 may be formed on the signal wiring 175. The second insulating interlayer 195 may cover the signal wiring 175 in the second light emitting region 12 and the fourth peripheral region 24 on the first insulating interlayer 190, and may be formed on the entire first insulating interlayer 190. For example, the second insulating interlayer 195 may sufficiently cover the signal wiring 175 in the second light emitting region 12 and the fourth peripheral region 24 on the first insulating interlayer 190, and may have a substantially flat upper surface without a step around the signal wiring 175. Alternatively, the second insulating interlayer 195 may cover the signal wiring 175 in the second light emitting region 12 and the fourth peripheral region 24 on the first insulating interlayer 190, and may be formed as a substantially uniform thickness along a profile of the signal wiring 175. The second insulating interlayer 195 may be formed using silicon compound, metal oxide, etc.

After the second insulating interlayer 195 is formed, first through fourth contact holes may be formed. Each of the first through fourth contact holes may be formed by removing each of first through fourth portions of the gate insulation layer 150, the first insulating interlayer 190, and the second insulating interlayer 195. The first contact hole may expose a source region of the active layer 130, and the second contact hole may expose a drain region of the active layer 130. The third contact hole may expose a portion of the pattern protrusion 510 of the active pattern 500, and the fourth contact hole may expose the wiring protrusion 520 of the upper gate wiring 300.

A preliminary second electrode layer 1600 may be formed on the second insulating interlayer 195. The preliminary second electrode layer 1600 may fill the first through fourth contact holes. The preliminary second electrode layer 1600 may be formed using a metal, a metal alloy, metal nitride, conductive metal oxide, transparent conductive materials, etc. These may be used alone or in a suitable combination thereof. Alternatively, the preliminary second electrode layer 1600 may have a multi-layered structure including a plurality of layers.

A third etch process, in which the preliminary second electrode layer 1600 is partially etched, may be performed after the preliminary second electrode layer 1600 is formed on the second insulating interlayer 195. For example, the third etch process may correspond to a dry etch process where the preliminary second electrode layer 1600 is etched using a plasma. While the third etch process is performed, static electricity may be generated, and the static electricity may flow into the preliminary second electrode layer 1600.

In example embodiments, as the upper gate wiring 300 overlaps the active pattern 500 in the fourth peripheral region 24, a parasitic capacitor may be formed, and a difference of a time constant may be relatively reduced between the first light emitting region 11 and the second and third light emitting regions 12 and 13. In addition, as the preliminary second electrode layer 1600 connects the upper gate wiring 300 and the active pattern 500 in the fourth peripheral region 24, a same signal may be applied although the upper gate wiring 300 and the active pattern 500 are cut by a static electricity. Further, it may prevent the static electricity from flowing from the fourth peripheral region 24 into the second light emitting region 12 or the third light emitting region 13. Thus, although the static electricity flows into the preliminary second electrode layer 1600, a semiconductor element formed in the first light emitting region 11 and a semiconductor element formed in the second and third light emitting regions 12 and 13 may be relatively less influenced by the static electricity.

Figure 15:
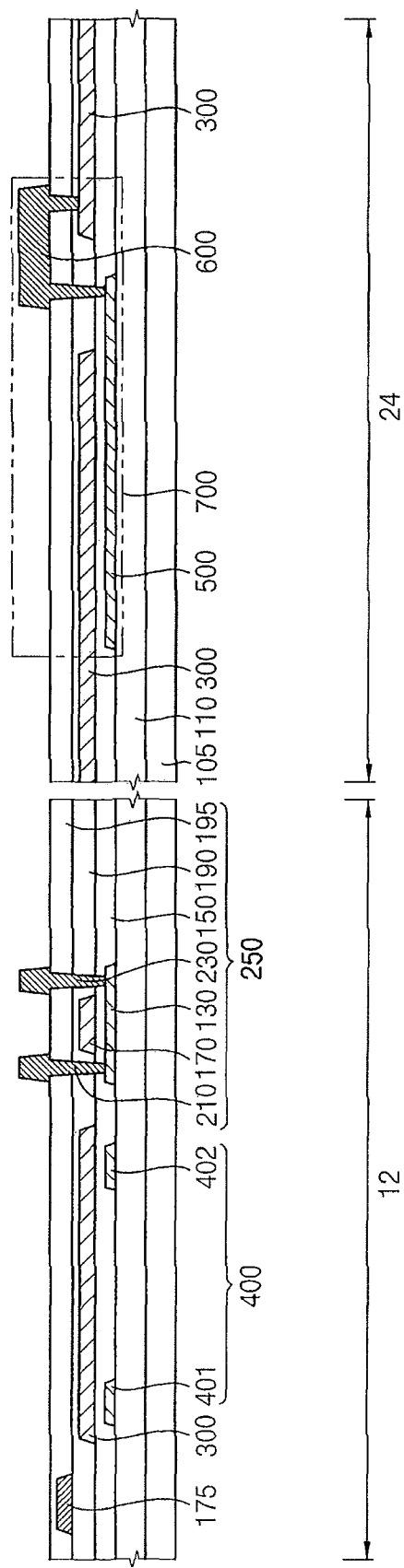

Referring to FIG. 15, after the third etch process is performed, the source electrode 210 and the drain electrode 230 may be formed in the second light emitting region 12 on the second insulating interlayer 195, and the connection pattern 600 may be formed in the fourth peripheral region 24 on the second insulating interlayer 195. The source electrode 210 may be in direct contact with a first side (e.g., a source region) of the active layer 130 via the first contact hole, and the drain electrode 230 may be in direct contact with a second side (e.g., a drain region) of the active layer 130 via the second contact hole. Accordingly, a semiconductor element 250 including the active layer 130, the gate insulation layer 150, the gate electrode 170, the first insulating interlayer 190, the second insulating interlayer 195, the source electrode 210, and the drain electrode 230 may be formed. The connection pattern 600 may be in contact with the pattern protrusion 510 and the wiring protrusion 520 via the third and fourth contact holes. Accordingly, a stack structure 700 including the active pattern 500, the upper gate wiring 300 overlapping the active pattern 500, and the connection pattern 600 may be formed. In example embodiments, the source electrode 210, the drain electrode 230, and the connection pattern 600 may be simultaneously formed using same materials.

Figure 16:
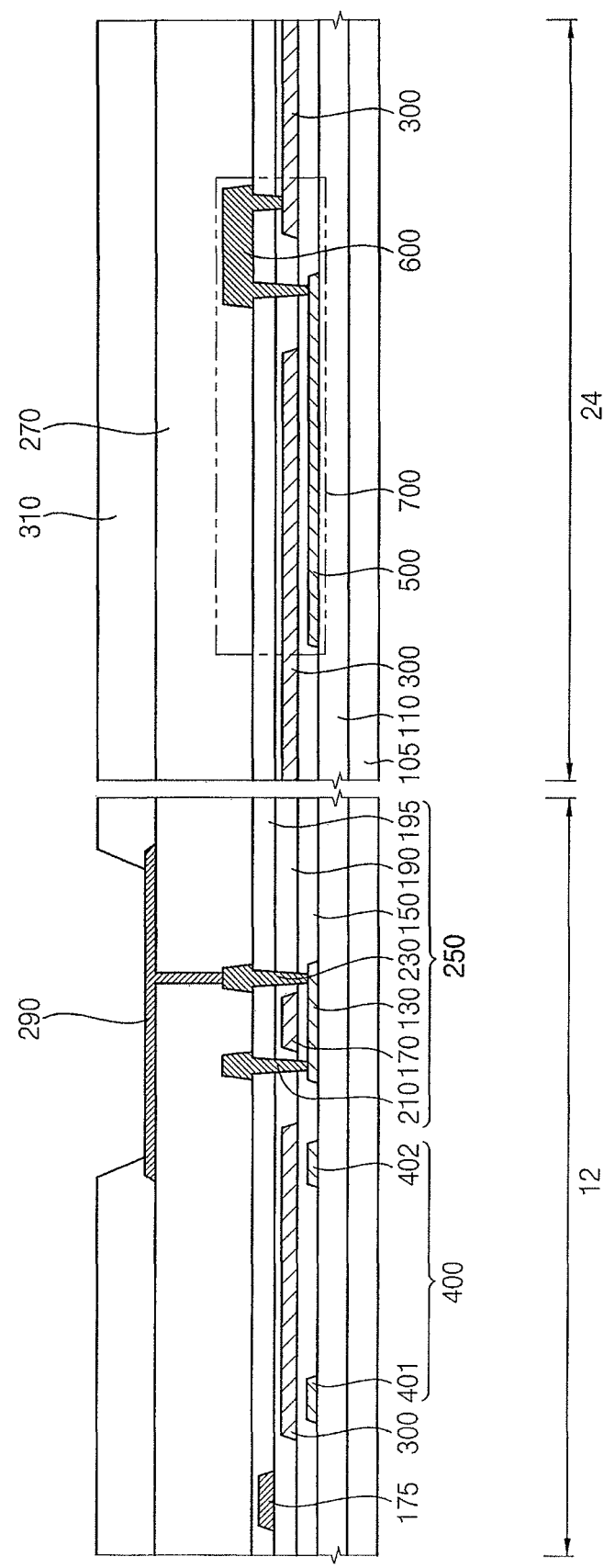

Referring to FIG. 16, the planarization layer 270 may be formed on the second insulating interlayer 195, the connection pattern 600, the source electrode 210, and the drain electrode 230, and may have a contact hole that exposes a portion of the semiconductor element 250. The planarization layer 270 may be formed at a high thickness to sufficiently cover the connection pattern 600 and the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In example embodiments, the planarization layer 270 may be formed using organic materials. For example, the planarization layer 270 may include a polyimide-based resin, a photoresist, an acryl-based resin, a polyamide-based resin, a siloxane-based resin, etc.

The lower electrode 290 may be formed in the second light emitting region 12 on the planarization layer 270. The lower electrode 290 may be in direct contact with the drain electrode 230 via the contact hole of the planarization layer 270, and may be electrically connected to the semiconductor element 250. The lower electrode 290 may be formed using, e.g., a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The pixel defining layer 310 may be formed on a portion of the lower electrode 290 and the planarization layer 270. The pixel defining layer 310 may cover both lateral portions of the lower electrode 290, and may have an opening that exposes a portion of an upper surface of the lower electrode 290. The pixel defining layer 310 may include organic materials or inorganic materials. In example embodiments, the pixel defining layer 310 may be formed using organic materials.

Figure 17:
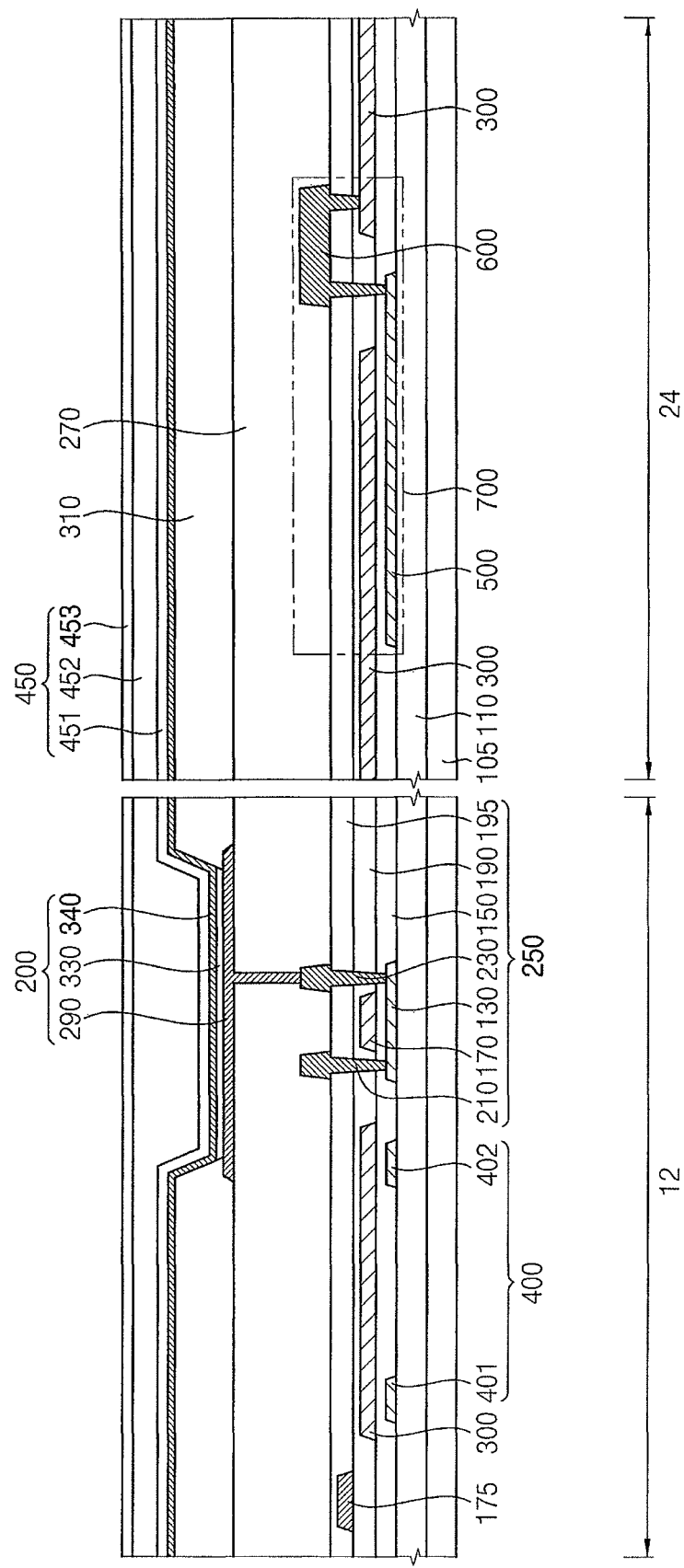

Referring to FIG. 17, the light emitting layer 330 may be formed on the lower electrode 290 exposed by the pixel defining layer 310. The light emitting layer 330 may be formed using at least one of light emitting materials capable of generating different colors of light (e.g., a red color of light, a blue color of light, and a green color of light) according to sub-pixels. Alternatively, the light emitting layer 330 may generally generate a white color of light by stacking a plurality of light emitting materials capable of generating different colors of light such as a red color of light, a green color of light, and a blue color of light. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin, a color photoresist, etc.

The upper electrode 340 may be formed on the pixel defining layer 310 and the light emitting layer 330. The upper electrode 340 may cover the light emitting layer 330 and the pixel defining layer 310, and may be formed on the entire substrate 110. The upper electrode 340 may be formed using, e.g., a metal, a metal alloy, metal nitride, conductive metal oxide, transparent conductive materials, etc. These may be used alone or in a suitable combination thereof.

Alternatively, the upper electrode 340 may have a multi-layered structure including a plurality of layers. Accordingly, a light emitting structure 200 including the lower electrode 290, the light emitting layer 330, and the upper electrode 340 may be formed.

The first TFE layer 451 may be formed on the upper electrode 340. The first TFE layer 451 may cover the upper electrode 340, and may be formed as a substantially uniform thickness along a profile of the upper electrode 340. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may be formed using inorganic materials having flexibility.

The second TFE layer 452 may be formed on the first TFE layer 451. The second TFE layer 452 may improve the flatness of an OLED display device, and may protect the light emitting structure 200. The second TFE layer 452 may be formed using organic materials having flexibility.

The third TFE layer 453 may be formed on the second TFE layer 452. The third TFE layer 453 may cover the second TFE layer 452, and may be formed as a substantially uniform thickness along a profile of the second TFE layer 452. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer 451 and the second TFE layer 452 may protect the light emitting structure 200 from external impacts. The third TFE layer 453 may be formed using inorganic materials having flexibility. Accordingly, a TFE structure 450 including the first TFE layer 451, the second TFE layer 452, and the third TFE layer 453 may be formed. Alternatively, the TFE structure 450 may have five layers structure where first through fifth TFE layers are stacked or seven layers structure where the first through seventh TFE layers are stacked. After the TFE structure 450 is formed, the rigid glass substrate 105 may be removed from the substrate 110.

Accordingly, the OLED display device 100 illustrated in FIGS. 6 and 7 may be manufactured. As described above, in a method of manufacturing the OLED display device 100, despite the static electricity flows, a semiconductor element formed in the first light emitting region 11 and a semiconductor element formed in the second and third light emitting regions 12 and 13 may be relatively less influenced by the static electricity.

Figure 18:
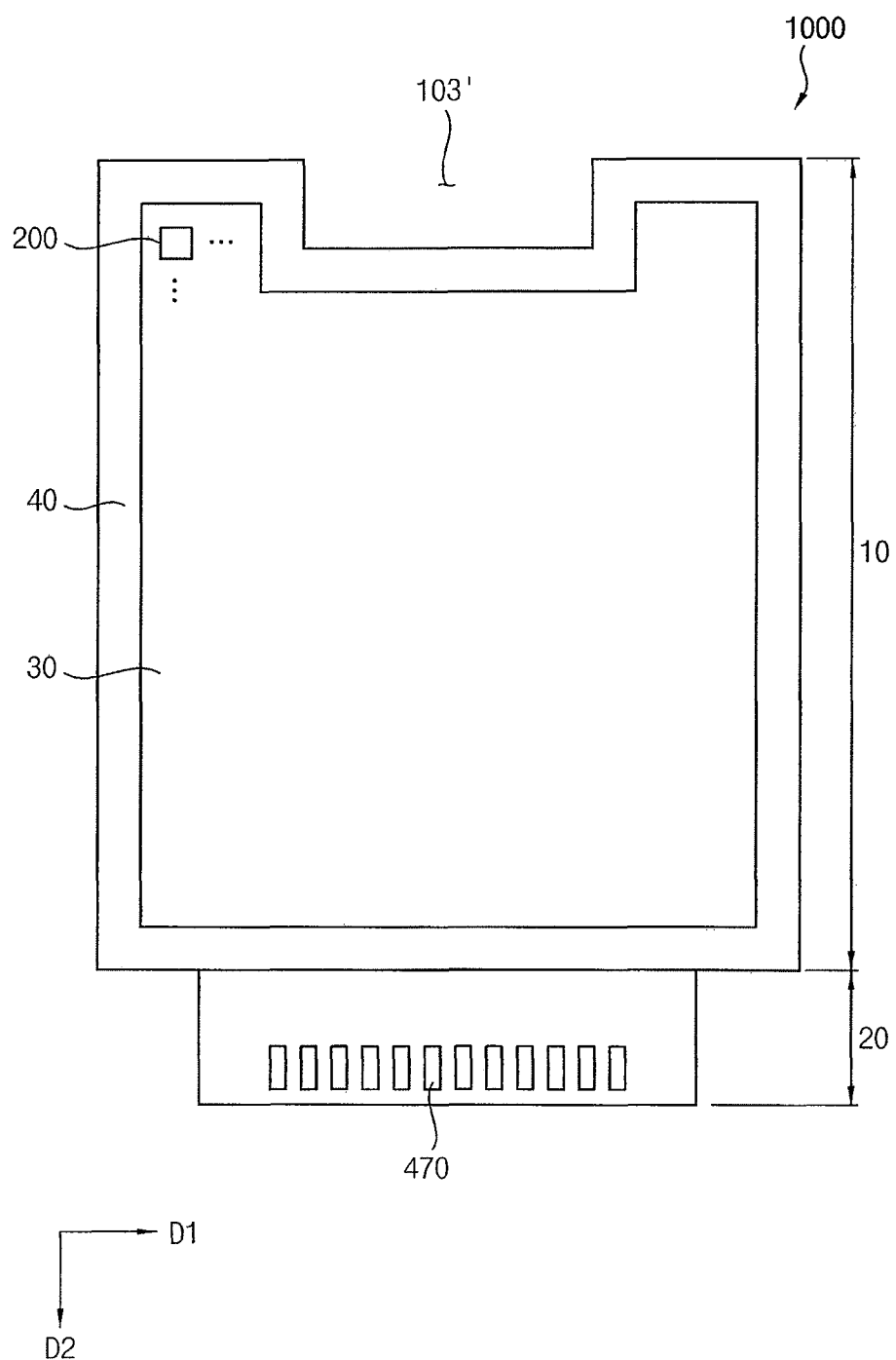
FIG. 18 illustrates a plan view of an OLED display device in accordance with example embodiments.
Figure 19:
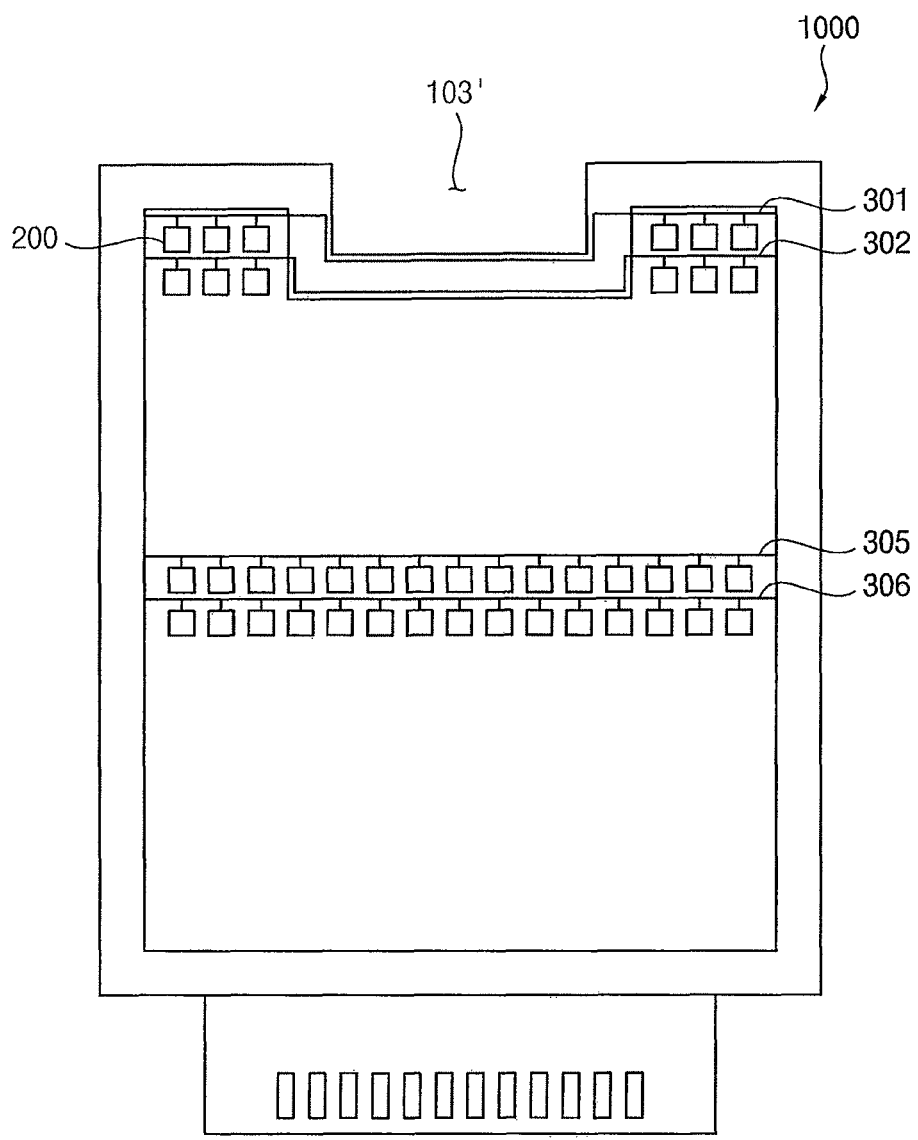
FIG. 19 illustrates a plan view of light emitting structures in first and second light emitting regions of the OLED display device of FIG. 18.

FIG. 18 is a plan view illustrating an OLED display device in accordance with example embodiments, and FIG. 19 is a plan view for describing light emitting structures disposed in first and second light emitting regions of in the OLED display device of FIG. 18. An OLED display device 1000 illustrated in FIGS. 18 and 19 may have a substantially same configuration as or similar to that of the OLED display device 100 described with reference to FIGS. 1 through 3, except for the shape of the trench 103. In FIGS. 18 and 19, detailed descriptions for elements that are substantially same as or similar to elements described with reference to FIGS. 1 through 3 may not be repeated.

Referring to FIGS. 2, 18 and 19, an OLED display device 1000 may include the display region 10 and the pad region 20. Here, the display region 10 may include the light emitting region 30 and the peripheral region 40 surrounding the light emitting region 30, and the light emitting region 30 may include the first light emitting region 11, the second light emitting region 12, and the third light emitting region 13. In addition, the peripheral region 40 may include the first peripheral region 21, the second peripheral region 22, the third peripheral region 23, and the fourth peripheral region 24.

The plurality of light emitting structures 200 may be disposed in the display region 10, and the pad region 20 may be located at the first side of the display region 10. The pad electrodes 470 may be disposed in the pad region 20, and may be electrically connected to an external device. Here, the width of the pad region 20 extending in the first direction D1 may be less than a width of the display region 10 extending in the first direction D1. Alternatively, the width of the pad region 20 may be identical to the width of the display region 10. For example, the first direction D1 may be a direction that is in parallel to an upper surface of the OLED display device 1000.

In example embodiments, the OLED display device 1000 may have a trench 103' located at the second side of the display region 10. Here, the first side of the display region 10 may be different from the second side of the display region 10. In other words, the OLED display device 1000 may have a dent shape in a direction from the peripheral region 40 into the light emitting region 30 in a portion of the display region 10. In addition, the shape of the trench 103' may have a plan shape of a quadrangle in a plan view of the OLED display device 1000, e.g., the trench 103' may be polygonal with first and second lateral sidewalls extending linearly toward the display region 10 along the second direction D2 with a linear third sidewall along the first direction D1 connecting the first and second lateral sidewalls.

The OLED display device 1000 may include the first upper gate wiring 301, the second upper gate wiring 302, the first lower gate wiring 305, the second lower gate wiring 306, etc. For convenience of descriptions, not all of wirings included in the OLED display device 1000 may be illustrated in FIG. 19. For example, the OLED display device 1000 may further include a data signal wiring, a light emission signal wiring, a power supply voltage wiring, etc.

In example embodiments, the first upper gate wiring 301, the second upper gate wiring 302, the first lower gate wiring 305, and the second lower gate wiring 306 may provide a gate signal to the light emitting structure 200. In example embodiments, the OLED display device 100 includes two upper gate wirings and two lower gate wirings in FIG. 19, but is not limited thereto. For example, the OLED display device 1000 may include a plurality of upper gate wirings and a plurality of lower gate wirings.

In example embodiments, the first upper gate wiring 301 and the second upper gate wiring 302 may be disposed in the second light emitting region 12, the fourth peripheral region 24, and the third light emitting region 13 on the substrate, and the first lower gate wiring 305 and the second lower gate wiring 306 may be disposed in the first light emitting region 11 on the substrate. In addition, each of first and second upper gate wirings 301 and 302 may have a shape of a substantially straight line in the second and third light emitting regions 12 and 13, and may have a shape of an inverted "Π" in the fourth peripheral region 24. In other words, each of the first and second upper gate wirings 301 and 302 may be disposed along a profile of the trench 103' in the fourth peripheral region 24, and may be integrally formed in the second light emitting region 12, the fourth peripheral region 24, and the third light emitting region 13. On the other hand, each of first and second lower gate wirings 305 and 305 may have a shape of a substantially straight line in the first light emitting region 11. That is, as illustrated in FIG. 19, a total distance of each of the first and second upper gate wirings 301 and 302 may be greater than a total distance of each of the first and second lower gate wirings 305 and 305.

In example embodiments, the plurality of the light emitting structures 200 may be disposed in the first light emitting region 11, the second light emitting region 12, and the third light emitting region 13. As illustrated in FIG. 19, the light emitting structures 200 may be electrically connected to each of the first upper gate wiring 301, the second upper gate wiring 302, the first lower gate wiring 305, and the second lower gate wiring 306. In example embodiments, the number of the light emitting structures 200 connected to the first upper gate wiring 301 may be identical to the number of the light emitting structures 200 connected to the second upper gate wiring 302. In other words, the number of the light emitting structures 200 arranged in each of the first directions D1 in the second light emitting region 12 and the third light emitting region 13 may be the same in the second direction D2. For example, in the second light emitting region 12 and the third light emitting region 13, an area of each of the second light emitting region 12 and the third light emitting region 13 may be the same in the second direction D2, i.e., have a constant with in the first direction D1, due to the quadrangular shape of the trench 103', which has a plan shape of a tetragon, formed on the substrate, and the number of the light emitting structures 200 arranged along the first direction D1 may be the same in the second direction D2.

In addition, since the first upper gate wiring 301 and the second upper gate wiring 302 are not connected to the light emitting structures 200 in the fourth peripheral region 24, the first upper gate wiring 301 and the second upper gate wiring 302 may be connected to the relatively small number of the light emitting structures 200 than the first lower gate wiring 305 and the second lower gate wiring 306. In this case, the load capacitance generated between the upper gate wiring (e.g., the first upper gate wiring 301 and the second upper gate wiring 302) and active wirings disposed under the upper gate wiring may be less than the load capacitance generated between the lower gate wiring (e.g., the first lower gate wiring 305 and the second lower gate wiring 306) and the active wirings disposed under the lower gate wiring. For example, the OLED display device 1000 may further include a plurality of semiconductor elements, and the semiconductor elements may be disposed under each of the light emitting structures 200. Here, the semiconductor elements may be connected to each other through the active wirings, and the active wirings and the gate wirings disposed on the active wirings may be partially overlapped. Here, a portion where the active wiring and the gate wiring are overlapped may be defined as an active layer of the semiconductor element. Accordingly, the load capacitance of the lower gate wirings connected to the relatively larger number of the light emitting structures 200 may be relatively greater than the load capacitance of the upper gate wirings connected to the relatively smaller number of the light emitting structures 200.

When a difference of the load capacitance occurs, a luminance difference of the light emitting structure 200 may occur between the first light emitting region 11 and the second and third light emitting regions 12 and 13. In this case, a visibility of the OLED display device 1000 may be reduced. However, in order to equalize, i.e., minimize, the difference of the load capacitance, the OLED display device 1000 according to example embodiments may further include a stack structure in the fourth peripheral region 24, which will be described below with reference to FIGS. 20-21.

Figure 20:
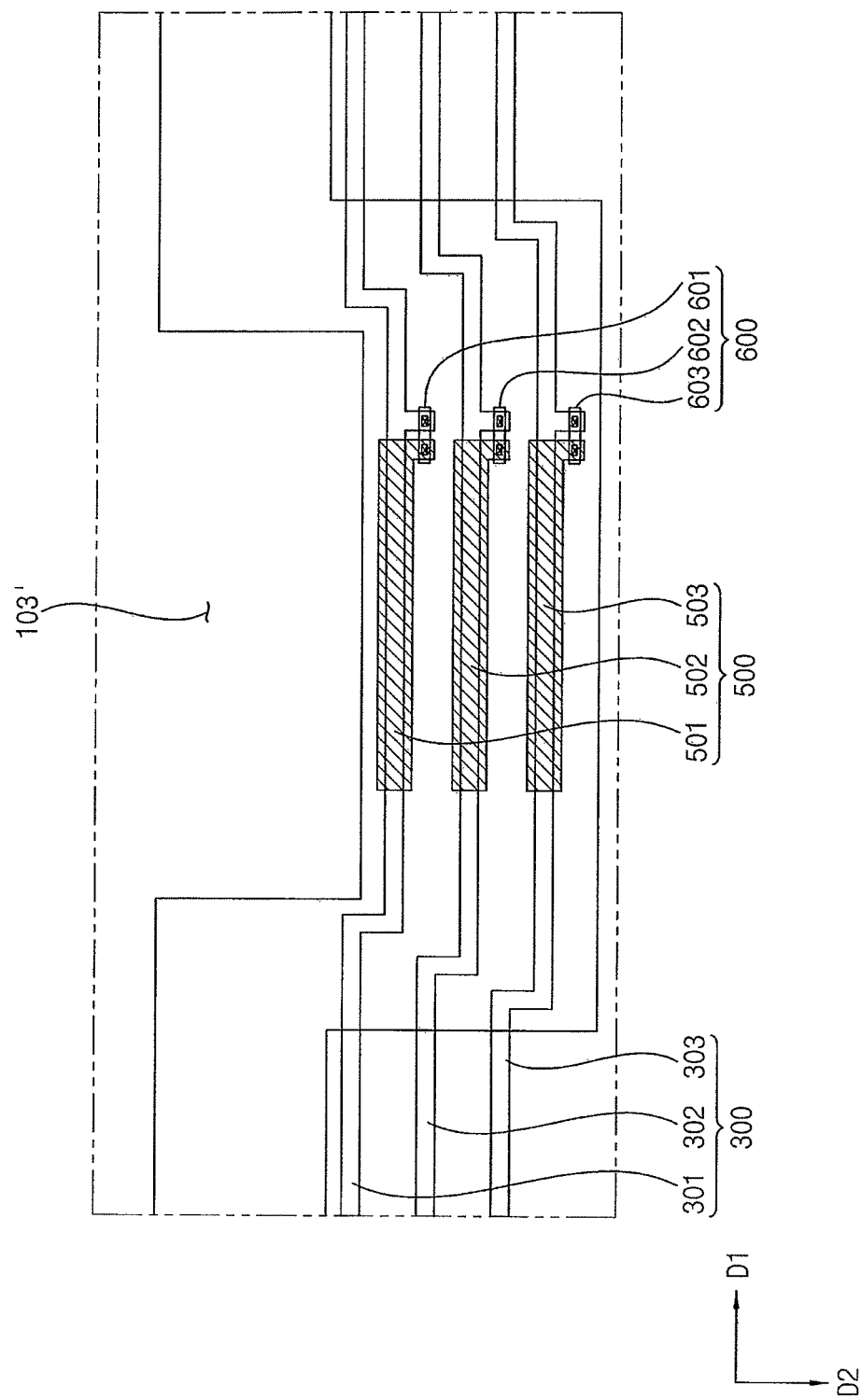
FIG. 20 illustrates a partially enlarged plan view of a stack structure in the OLED display device of FIG. 18.
Figure 21:
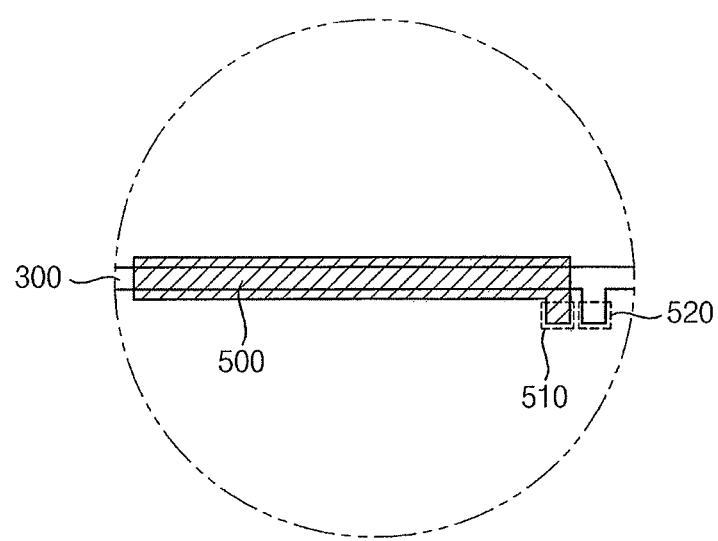
FIG. 21 illustrates a partially enlarged plan view of a pattern protrusion and a wiring protrusion in the stack structure of FIG. 20.

FIG. 20 is a partially enlarged plan view for describing a stack structure included in the OLED display device of FIG. 18, and FIG. 21 is a partially enlarged plan view for describing a pattern protrusion and a wiring protrusion included in the stack structure of FIG. 20. The OLED display device 1000 illustrated in FIGS. 20 and 21 has a substantially same configuration as the OLED display device 100 described with reference to FIGS. 1-5, except for the shape of a trench and the corresponding shape of the stack structure. In FIGS. 20 and 21, detailed descriptions for elements that are substantially the same as or similar to elements described with reference to FIGS. 4 and 5 may not be repeated.

Referring to FIG. 18 through 21, the OLED display device 1000 may include the upper gate wiring 300, the active pattern 500, the connection pattern 600, etc. For example, the upper gate wiring 300, the active pattern 500, and the active pattern 500 may be disposed on the substrate.

The active pattern 500 may be disposed along a profile of the trench 103' in the peripheral region 40 (e.g., the fourth peripheral region 24) located adjacent to trench 103'. That is, the active pattern 500 may have a shape of a straight line in the fourth peripheral region 24. The active pattern 500 may include the first active pattern 501, the second active pattern 502, and the third active pattern 503. The active pattern 500 may be disposed in the fourth peripheral region 24 on the substrate. For example, the first active pattern 501 may be disposed at an outmost portion of the fourth peripheral region 24, and the third active pattern 503 may be disposed at an inside portion of the fourth peripheral region 24 (or disposed adjacent to the first light emitting region 11). The second active pattern 502 may be disposed between the first active pattern 501 and the third active pattern 503. In example embodiments, a total distance of each of the first active pattern 501, the second active pattern 502, and the third active pattern 503 may be the same.

As illustrated in FIG. 21, the active pattern 500 may have the pattern protrusion 510. The pattern protrusion 510 may protrude from the active pattern 500 in a direction (e.g., the second direction D2) that is different from a longitudinal direction (e.g., the first direction D1). The pattern protrusion 510 may be formed in each of the first active pattern 501, the second active pattern 502, and the third active pattern 503.

In other words, the active pattern 500 may include first through (N)th active patterns, where N is an integer greater than 1, and the first through (N)th active patterns may be disposed in the fourth peripheral region 24. The first active pattern among the first through (N)th active patterns may be disposed at an outermost portion of the fourth peripheral region 24, and the (N)th active pattern among the first through (N)th active patterns may be disposed at an inside portion of the fourth peripheral region 24 (disposed adjacent to the first light emitting region 11). A distance (e.g. a total distance) of the (K)th active pattern among the first through (N)th active patterns may be identical to a distance of the (K+1)th active pattern among the first through (N)th active patterns, where K is an integer between 1 and N.

The upper gate wiring 300 may be disposed on and overlap the active pattern 500 in the peripheral region 40 (e.g., the fourth peripheral region 24) located adjacent to the trench 103'. The upper gate wiring 300 may include the first upper gate wiring 301, the second upper gate wiring 302, and the third upper gate wiring 303. For example, the first upper gate wiring 301 may be disposed on and overlap the first active pattern 501, and the second upper gate wiring 302 may be disposed on and overlap the second active pattern 502. The third upper gate wiring 303 may be disposed on and overlap the third active pattern 503.

In example embodiments, a total area where the first upper gate wiring 301 overlaps the first active pattern 501 may be identical to a total area where the second upper gate wiring 302 overlaps the second active pattern 502, and the total area where the second upper gate wiring 302 overlaps the second active pattern 502 may be identical to a total area where the third upper gate wiring 303 overlaps the third active pattern 503. In other words, a total area where the upper gate wiring 300 overlaps the active pattern 500 may be the same.

As illustrated in FIG. 21, the upper gate wiring 300 may have the wiring protrusion 520. The wiring protrusion 520 may protrude from the upper gate wiring 300 in a direction that is different from a longitudinal direction, and may be may be located adjacent to the pattern protrusion 510. The wiring protrusion 520 may be formed in each of the first upper gate wiring 301, the second upper gate wiring 302, and the third upper gate wiring 303.

In other words, the upper gate wiring 300 may include first through (M)th upper gate wirings, where M is an integer greater than 1, and the (K)th active pattern among the first through (N)th active patterns may be disposed to overlap the (L)th upper gate wiring among first through (M)th upper gate wirings, where K is an integer between 1 and N, and L is an integer between 1 and M.

The connection pattern 600 may be disposed on and overlap the pattern protrusion 510 and the wiring protrusion 520, and may electrically connect the pattern protrusion 510 and the wiring protrusion 520 through a contact hole. The connection pattern 600 may include the first connection pattern 601, the second connection pattern 602, and the third connection pattern 603. For example, the first connection pattern 601 may be disposed on and overlap the pattern protrusion of the first active pattern 501 and the wiring protrusion of the first upper gate wiring 301, and the second connection pattern 602 may be disposed on and overlap the pattern protrusion of the second active pattern 502 and the wiring protrusion of the second upper gate wiring 302. The third connection pattern 603 may be disposed on and overlap the pattern protrusion of the third active pattern 503 and the wiring protrusion of the third upper gate wiring 303. In example embodiments, the connection pattern 600 together with the active pattern 500 and the upper gate wiring 300 overlapping the active pattern 500 may be defined as a stack structure. For example, the first active pattern 501, the first upper gate wiring 301 overlapping the first active pattern 501, and the first connection pattern 601 may be defined as a first stack structure, and the second active pattern 502, the second upper gate wiring 302 overlapping the second active pattern 502, and the second connection pattern 602 may be defined as a second stack structure. The third active pattern 503, the third upper gate wiring 303 overlapping the third active pattern 503, and the third connection pattern 603 may be defined as third stack structure. The stack structure may form a parasitic capacitor between the active pattern 500 and the upper gate wiring 300, and a difference of a load capacitance between a lower gate wiring disposed in the first light emitting region 11 and the upper gate wiring 300 may be prevented to substantially minimized due to the parasitic capacitor.

As described above, since each of the first upper gate wiring 301, the second upper gate wiring 302, and the third upper gate wiring 303 are connected to the same number of the light emitting structure 200, an area where each of the first through third upper gate wirings 301, 302, and 303 overlaps each of the first through third active patterns 501, 502, and 503 may be substantially the same as to equalize the load capacitance of the first through third upper gate wirings 301, 302, and 303. Accordingly, the luminance difference might not occur in the first light emitting region 11 and the second and third light emitting regions 12 and 13, and the visibility of the OLED display device 1000 may be relatively increased.

In example embodiments, the OLED display device 1000 includes three stack structures including three active patterns 500, three upper gate wirings 300, and three connection patterns 600, but is not limited thereto. For example, in some example embodiments, the OLED display device 1000 may include at least four stack structures including at least four active patterns 500, at least four upper gate wirings 300, and at least four connection patterns 600.

Example embodiments may be applied to various display devices including an OLED display device. For example, example embodiments may be applied to vehicle-display device, a ship-display device, an aircraft-display device, portable communication devices, display devices for display or for information transfer, a medical-display device, etc.

By way of summation and review, the number of light emitting structures arranged along a row direction in regions adjacent the trench may be different from the number of light emitting structure arranged along the row direction in the a region not including the trench, e.g., the number of the light emitting structures arranged in regions adjacent the trench may be smaller. In this case, the load capacitance between the light emitting structures in the regions adjacent the trench and the region not including the trench may be different. In addition, in a process for manufacturing the OLED display device, a semiconductor element may be damaged by static electricity. A luminance difference may occur in the regions adjacent the trench and the region not including the trench because of the load capacitance difference and the damage to the semiconductor element caused by the static electricity, thereby reducing visibility of the OLED display device.

In contrast, as the OLED display device according to example embodiments includes a stack structure in region surrounding the trench, a difference of the load capacitance may prevented or substantially minimized. Accordingly, a luminance difference of the different light emitting regions may not occur, thereby improving visibility, e.g., display properties, of the OLED display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode ("OLED") display device, comprising:
  a substrate including:

a display region having a light emitting region and a peripheral region surrounding the light emitting region,
a pad region at a first side of the display region, and a trench at a second side of the display region;
a plurality of light emitting structures on the light emitting region of the substrate;
an active pattern along a profile of the trench on the peripheral region of the substrate, the active pattern being adjacent to the trench and including a pattern protrusion; and
an upper gate wiring on and overlapping the active pattern, the upper gate wiring having a wiring protrusion adjacent to the pattern protrusion.

2. The OLED display device as claimed in claim 1, further comprising:
a connection pattern on and overlapping the pattern protrusion and the wiring protrusion, the connection pattern electrically connecting the pattern protrusion and the wiring protrusion through a contact hole,
wherein the connection pattern together with the active pattern and the upper gate wiring overlapping the active pattern is defined as a stack structure.

3. The OLED display device as claimed in claim 1, wherein the light emitting region of the substrate includes:
a first light emitting region adjacent to the pad region; and
second and third light emitting regions along lateral sides of the trench.

4. The OLED display device as claimed in claim 3, wherein the first light emitting region has a first width, and each of the second and third light emitting regions has a second width that is less than the first width.

5. The OLED display device as claimed in claim 3, wherein the peripheral region of the substrate includes:
a first peripheral region adjacent to the first light emitting region;
second and third peripheral regions adjacent to the second and third light emitting regions, respectively; and
a fourth peripheral region adjacent to the trench.

6. The OLED display device as claimed in claim 5, wherein a portion of the fourth peripheral region is between the first light emitting region and the trench, and a remaining portion of the fourth peripheral region is between each of the second and third light emitting regions and the trench.

7. The OLED display device as claimed in claim 5, further comprising:
a lower gate wiring in the first light emitting region, the lower gate wiring having a shape of a straight line,
wherein the upper gate wiring is in the second and third light emitting regions and in the fourth peripheral region, and a total length of the upper gate wiring is greater than a total length of the lower gate wiring.

8. The OLED display device as claimed in claim 5, wherein a shape of the trench has a plan shape of a semicircle, as viewed in a top view of the OLED display device.

9. The OLED display device as claimed in claim 8, wherein:
the active pattern has a shape of a curve in the fourth peripheral region, and
the upper gate wiring has a shape of a straight line in the second and third light emitting regions, and has a shape of a curve in the fourth peripheral region.

10. The OLED display device as claimed in claim 9, wherein:

the plurality of light emitting structures are arranged in rows in each of the first through third light emitting regions, and
a number of the light emitting structures arranged in each row in the second and third light emitting regions is gradually increased in a direction oriented from the display region toward the pad region.

11. The OLED display device as claimed in claim 8, wherein the active pattern includes first through (N)th active patterns, where N is an integer greater than 1, and the first through (N)th active patterns are in the fourth peripheral region.

12. The OLED display device as claimed in claim 11, wherein the first active pattern among the first through (N)th active patterns is at an outermost portion of the fourth peripheral region, and the (N)th active pattern among the first through (N)th active patterns is at an innermost portion of the fourth peripheral region.

13. The OLED display device as claimed in claim 11, wherein a length of a (K)th active pattern among the first through (N)th active patterns is greater than a length of a (K+1)th active pattern among the first through (N)th active patterns, where K is an integer between 1 and N.

14. The OLED display device as claimed in claim 11, wherein the upper gate wiring includes first through (M)th upper gate wirings, where M is an integer greater than 1, and a (K)th active pattern among the first through (N)th active patterns is disposed to overlap an (L)th upper gate wiring among first through (M)th upper gate wirings, where K is an integer between 1 and N, and L is an integer between 1 and M.

15. The OLED display device as claimed in claim 5, wherein a shape of the trench has a plan shape of a tetragon, as viewed in a top view of the OLED display device.

16. The OLED display device as claimed in claim 15, wherein:
the active pattern has a shape of a straight line in the fourth peripheral region, and
the upper gate wiring has a shape of a straight line in the second and third light emitting regions, and has an inverted Π-shape in the fourth peripheral region.

17. The OLED display device as claimed in claim 15, wherein:
the plurality of light emitting structures are arranged in rows in each of the first through third light emitting regions, and
a number of the light emitting structures arranged in each row in the second and third light emitting regions is constant.

18. The OLED display device as claimed in claim 15, wherein the active pattern includes first through (N)th active patterns, where N is an integer greater than 1, and the first through (N)th active patterns are in the fourth peripheral region.

19. The OLED display device as claimed in claim 18, wherein a length of a (K)th active pattern among the first through (N)th active patterns is identical to a length of a (K+1)th active pattern among the first through (N)th active patterns, where K is an integer between 1 and N.

20. The OLED display device as claimed in claim 1, further comprising:
a plurality of semiconductor elements in the display region between the substrate and the light emitting structures,
wherein each of the semiconductor elements includes:
an active layer on the substrate,
a gate insulation layer on the active layer, a gate electrode on the gate insulation layer,
a first insulating interlayer on the gate electrode, and
source and drain electrodes on the first insulating interlayer,
wherein the active pattern and the active layer are at a same layer, and
the upper gate wiring and the gate electrode are at a same layer.

* * * * *